United States Patent
Kang

(10) Patent No.: US 6,285,576 B1
(45) Date of Patent: Sep. 4, 2001

(54) NONVOLATILE FERROELECTRIC MEMORY

(75) Inventor: Hee Bok Kang, Daejeon-si (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/653,580

(22) Filed: Aug. 31, 2000

(30) Foreign Application Priority Data

Sep. 8, 1999 (KR) .................................................. 99-38150

(51) Int. Cl.$^7$ ...................................................... G11C 12/22
(52) U.S. Cl. ........................................... 365/145; 365/203
(58) Field of Search .................................. 365/145, 149, 365/203

(56) References Cited

U.S. PATENT DOCUMENTS

| | | | |
|---|---|---|---|
| 4,873,664 | 10/1989 | Eaton, Jr. ............................. | 365/145 |
| 5,617,349 | * 4/1997 | Koike .................................... | 365/145 |
| 5,671,174 | * 9/1997 | Koike et al. .......................... | 365/145 |
| 5,680,344 | 10/1997 | Seyyedy .............................. | 365/145 |
| 5,694,353 | * 12/1997 | Koike .................................... | 365/145 |

* cited by examiner

*Primary Examiner*—Trong Phan
(74) *Attorney, Agent, or Firm*—Fleshner & Kim, LLP

(57) ABSTRACT

Nonvolatile ferroelectric memory stabilizes a reference level for obtaining a fast response speed and a reference level free from a noise. The nonvolatile memory device can include a cell array unit having at least one reference bitline, a plurality of main bitlines on one side of the reference bitline, and a plurality of pairs of first and second split wordlines in a direction crossing the bitlines. An equalizing unit equalizes adjacent bitlines inclusive of a reference bitline, among the main bitlines, and a precharge level adjustor adjusts a precharge level of the bitline in response to a combination of a first precharge control signal and a second precharge control signal. A sense amplifier unit is for sensing a signal on the main bitline, and a reference level generating unit is for receiving the reference bitline signal, and forwarding the reference bitline signal as a reference voltage for the sense amplifiers.

34 Claims, 18 Drawing Sheets

NONVOLATILE FERROELECTRIC MEMORY

BACKGROUND OF THE INVENTION

1. Field of the Invention

The present invention relates to a semiconductor device, and more particularly, to a nonvolatile ferroelectric memory.

2. Background of the Related Art

Generally, a nonvolatile ferroelectric memory, i.e., a ferroelectric random access memory (FRAM) has a data processing speed equal to a dynamic random access memory (DRAM) and retains data even in power off. For this reason, the nonvolatile ferroelectric memory has received much attention as a next generation memory device.

The FRAM and DRAM are memory devices with similar structures, but the FRAM includes a ferroelectric capacitor having a high residual polarization characteristic. The residual polarization characteristic permits data to be maintained even if an electric field is removed.

FIG. 1 shows hysteresis loop of a general ferroelectric. As shown in FIG. 1, even if polarization induced by the electric field has the electric field removed, data is maintained at a certain amount (i.e., d and a states) without being erased due to the presence of residual polarization (or spontaneous polarization). A nonvolatile ferroelectric memory cell is used as a memory device by corresponding the d and a states to 1 and 0, respectively.

A related art nonvolatile ferroelectric memory device will now be described. FIG. 2 shows unit cell of a related art nonvolatile ferroelectric memory.

As shown in FIG. 2, the related art nonvolatile ferroelectric memory includes a bitline B/L formed in one direction, a wordline W/L formed to cross the bitline, a plate line P/L spaced apart from the wordline in the same direction as the wordline, a transistor T1 with a gate connected with the wordline and a source connected with the bitline, and a ferroelectric capacitor FC1. A first terminal of the ferroelectric capacitor FC1 is connected with a drain of the transistor T1 and second terminal is connected with the plate line P/L.

The data input/output operation of the related art nonvolatile ferroelectric memory device will now be described. FIG. 3a is a timing chart illustrating the operation of the write mode of the related art nonvolatile ferroelectric memory device, and FIG. 3b is a timing chart illustrating the operation of read mode thereof.

During the write mode, an externally applied chip enable signal CSBpad is activated from high state to low state. At the same time, if a write enable signal WEBpad is applied from high state to low state, the write mode starts. Subsequently, if address decoding in the write mode starts, a pulse applied to a corresponding wordline is transited from low state to high state to select a cell.

A high signal in a certain period and a low signal in a certain period are sequentially applied to a corresponding plate line in a period where the wordline is maintained at high state. To write a logic value "1" or "0" in the selected cell, a high signal or low signal synchronized with the write enable signal WEBpad is applied to a corresponding bitline.

In other words, a high signal is applied to the bitline, and if the low signal is applied to the plate line in a period where the signal applied to the wordline is high, a logic value "1" is written in the ferroelectric capacitor. A low signal is applied to the bitline, and if the signal applied to the plate line is high, a logic value "0" is written in the ferroelectric capacitor.

The reading operation of data stored in a cell by the above operation of the write mode will now be described. If an externally applied chip enable signal CSBpad is activated from high state to low state, all of bitlines become equipotential to low voltage by an equalizer signal EQ before a corresponding wordline is selected.

Then, the respective bitline becomes inactive and an address is decoded. The low signal is transited to the high signal in the corresponding wordline according to the decoded address so that a corresponding cell is selected.

The high signal is applied to the plate line of the selected cell to destroy data corresponding to the logic value "1" stored in the ferroelectric memory. If the logic value "0" is stored in the ferroelectric memory, the corresponding data is not destroyed.

The destroyed data and the data that is not destroyed are output as different values by the ferroelectric hysteresis loop, so that a sensing amplifier senses the logic value "1" or "0". In other words, if the data is destroyed, the "d" state is transited to an "f" state as shown in hysteresis loop of FIG. 1. If the data is not destroyed, "a" state is transited to the "f" state. Thus, if the sensing amplifier is enabled after a set time has elapsed, the logic value "1" is output in case that the data is destroyed while the logic value "0" is output in case that the data is not destroyed.

As described above, after the sensing amplifier outputs data, to recover the data to the original data, the plate line becomes inactive from high state to low state at the state that the high signal is applied to the corresponding wordline.

FIG. 4 is a block diagram showing the related art nonvolatile ferroelectric memory device. As shown in FIG. 4, the related art nonvolatile ferroelectric memory device includes a main cell array 41, a reference cell array 42 assigned on a lower part of the main cell array 41, a wordline driver 43 formed at a side of the main cell array for applying a driving signal to the main cell array 41 and the reference cell array 42, and a sense amplifier unit 44 formed at a lower part of the reference cell array 42.

The wordline driver 43 applies the driving signal to a main wordline of the main cell array 41 and a reference wordline of the reference cell array 42. The sense amplifier unit 44 includes a plurality of sense amplifiers that each amplifies signals of a corresponding bitline B/L and bit bar line BB/L.

The operation of the related art nonvolatile ferroelectric memory device will now be described with reference to FIG. 5. FIG. 5 is a partially detailed view of FIG. 4. As shown in the drawing, the main cell array has a folded bitline structure in the same manner as DRAM.

Also, the reference cell array 42 has a folded bitline structure and includes a reference cell wordline and a reference cell plate line in pairs. At this time, reference cell wordline and the reference cell plate line pairs are defined as RWL_1 and RPL_1, and RWL_2 and RPL_2, respectively.

When the main cell wordline MWL_N-1 and the main cell plate line MPL_N-1 are activated, the reference cell wordline RWL_1 and the reference cell plate line RPL_1 are activated. Therefore, data in the main cell is loaded into the bitline B/L and data in the reference cell is loaded into the bit bar line BB/L.

When the main cell wordline MWL_N and the main cell plate line MPL_N are activated, the reference cell wordline RWL_2 and the reference cell plate line RPL_2 are activated. Therefore, data in the main cell is loaded into the bit bar line BB/L and data in the reference cell is loaded into the bitline B/L.

The reference voltage REF by the reference cell exists between the bitline levels B_H(high) and B_L(low) by the main cell. To generate the reference voltage REF between the bitline levels B_H and B_L, the logic value "1" or "0" may be stored in a capacitor of the reference cell. When the logic value "1" is stored in the capacitor of the reference cell, the size of the capacitor of the reference cell is smaller than that of the capacitor of the main cell. When the logic value "0" is stored in the capacitor of the reference cell, the size of the capacitor of the reference cell is greater than that of the capacitor of the main cell.

As described above, the related art nonvolatile ferroelectric memory has various disadvantages. If a capacitor size of the reference cell is smaller, the excessive access to the capacitor of the reference cell compared to the main cell causes fatigue or breakdown of the reference cell before the main cell, which results in an unstable reference level. The unstable reference level is affected by noise that can impede a stable sensing operation. If a capacitor size of the reference cell is made larger than a capacitor size of the main cell for storing logic "0" therein, such fatigue can be prevented, but the capacitor size should be made larger.

The above references are incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter.

An object of the present invention is to provide a nonvolatile ferroelectric memory that substantially obviates one or more of the problems due to limitations and disadvantages of the related art.

Another object of the present invention is to provide a nonvolatile ferroelectric memory that has a stabilized reference level.

Another object of the present invention is to provide a nonvolatile ferroelectric memory that has a faster or decreased response speed.

Another object of the present invention is to provide a nonvolatile ferroelectric memory in which a reference level is stabilized for obtaining a fast response speed and a reference level free from a noise.

To achieve at least these objects and other advantages in a whole or in part and in accordance with the purpose of the present invention, as embodied and broadly described, there is provided a nonvolatile ferroelectric memory that includes a cell array having at least one reference bitline and a plurality of main bitlines that extend along a first direction, and a plurality of pairs of first and second split wordlines that extend along a second direction to cross the bitlines, an equalizing unit that equalizes the main and reference bitlines, a precharge level adjustor that adjusts a precharge level of the bitlines in response to a combination of a first precharge control signal and a second precharge control signal, a sense amplifier that senses signals on the main bitlines and a reference level generator that receives a reference bitline signal and forwards a reference voltage for the sense amplifier.

To further achieve the above objects in a whole or a part and in accordance with the purpose of the present invention, there is provided a nonvolatile ferroelectric memory that includes a cell array unit having a first and second reference bitlines, and a plurality of main bitlines on one side of the reference bitlines that extend along a first direction, and a plurality of pairs of first and second split wordlines that extend in a second direction crossing the bitlines, a first equalizer under the cell array unit that equalizes adjacent bitlines among odd numbered main bitlines and the first reference bitline, a first precharge level adjustor that adjusts levels of the odd numbered bitlines and the first reference bitline in response to a first precharge control signal and a second precharge control signal, a first sense amplifier that senses and amplifies signals on the odd numbered bitlines, a first reference level generator that receives amplifies a signal on the first reference bitline and provides a result as a reference signal for the first sense amplifier, a second equalizer over the cell array unit that equalizes adjacent bitlines among even numbered main bitlines and the second reference bitline, a second precharge level adjustor that adjusts levels of the even numbered bitlines and the second reference bitline in response to the first precharge control signal and the second precharge control signal, a second sense amplifier that senses and amplifies signals on the even numbered bitlines and a second reference level generator that amplifies a signal on the second reference bitline and provides a result as a reference signal to the second sense amplifier.

To further achieve the above objects in a whole or a part and in accordance with the purpose of the present invention, there is provided a memory device having a cell array with at least one reference bitline and a plurality of main bitlines that extend along a first direction, and a plurality wordlines that extend along a second direction to cross the bitlines, a decoder coupled to the bitlines, a driving circuit coupled to the wordlines, and a sense amplifier that senses signals on the main bitlines, the improvement including a precharge level adjustor that adjusts a precharge level of the bitlines in response to a combination of the first precharge control signal and a second precharge control signal, wherein the precharge supply signal generator includes a transition generator that detects a pad signal to generate a transition detection signal, an enable adjustor that receives the transition detection signal and provides a first enable signal and a second enable signal, a reference signal forwarding unit enabled in response to the first enable signal to provide a precharge reference signal, a precharge level comparator enabled in response to the second enable signal to compare the precharge reference signal to a feedback control signal, a precharge level generator controlled by a driving signal from the precharge level comparator that outputs the feedback control signal, and a first precharge control signal forwarding unit that receives a supply signal from the precharge level generator to provide the first precharge control signal.

To further achieve the above objects in a whole or a part and in accordance with the purpose of the present invention, there is provided a memory device having a cell array with at least one reference bitline and a plurality of main bitlines that extend along a first direction, and a plurality wordlines that extend along a second direction to cross the bitlines, a decoder coupled to the bitlines, a driving circuit coupled to the wordlines, and a sense amplifier that senses signals on the main bitlines, the improvement including a reference level generator that receives a reference bitline signal and forwards a reference voltage for the sense amplifiers, wherein the reference level generator includes a first comparing and amplifying unit that compares the reference bitline signal to a signal fed back thereto, and amplifies an output signal, a second comparing and amplifying unit that compares the reference bitline signal to a signal fed back thereto, and amplifies an signal, a reference output adjusting unit that adjusts a level of the reference signal in response to the output signals from the first and second comparing and amplifying units, a reference output buffer that buffers the adjusted reference signal in the reference output adjusting unit, a reference output precharge adjusting unit that adjusts a precharge level of the reference bitline to a precharge level of a main bitline in response to a first precharge control signal and the transition detection signal, a first enable adjusting unit that enables the first comparing and amplifying unit, and a second enable adjusting unit that enables the second comparing and amplifying unit.

It is to be understood that both the foregoing general description and the following detailed description are exemplary and explanatory and are intended to provide further explanation of the invention as claimed.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
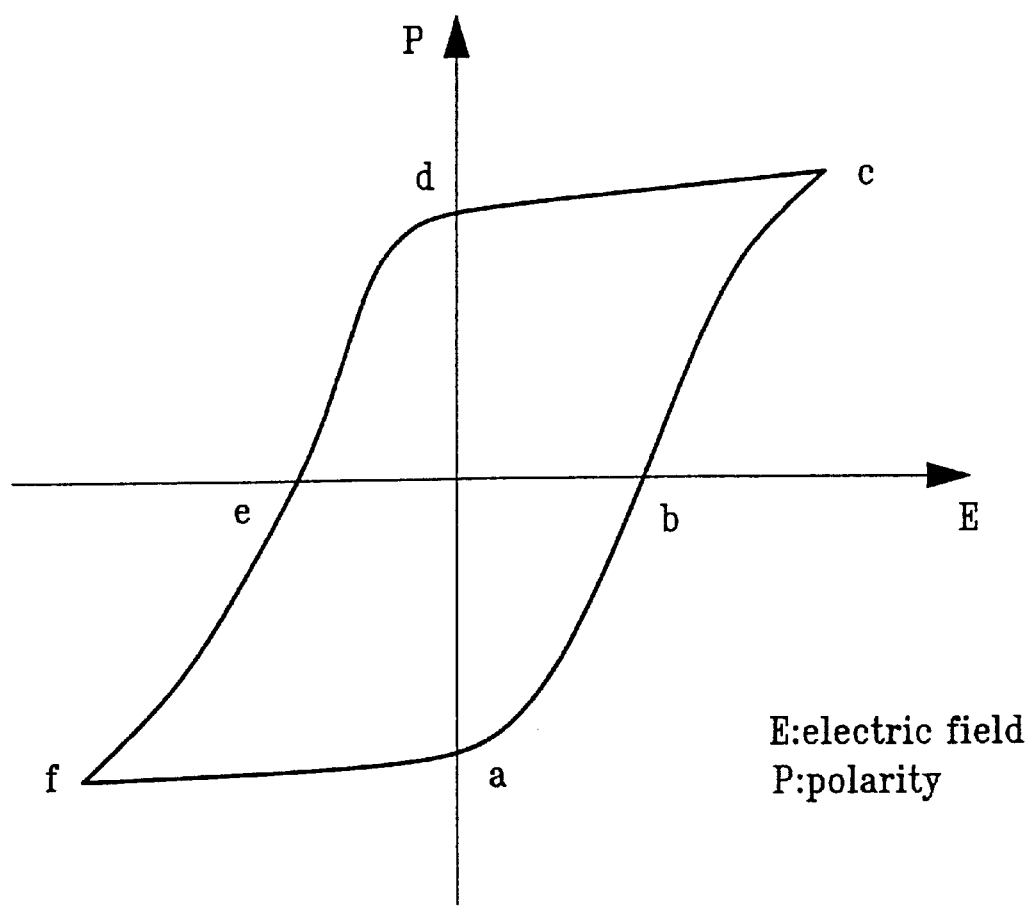
FIG. 1 shows a hysteresis loop of a ferroelectric.
Figure 2:
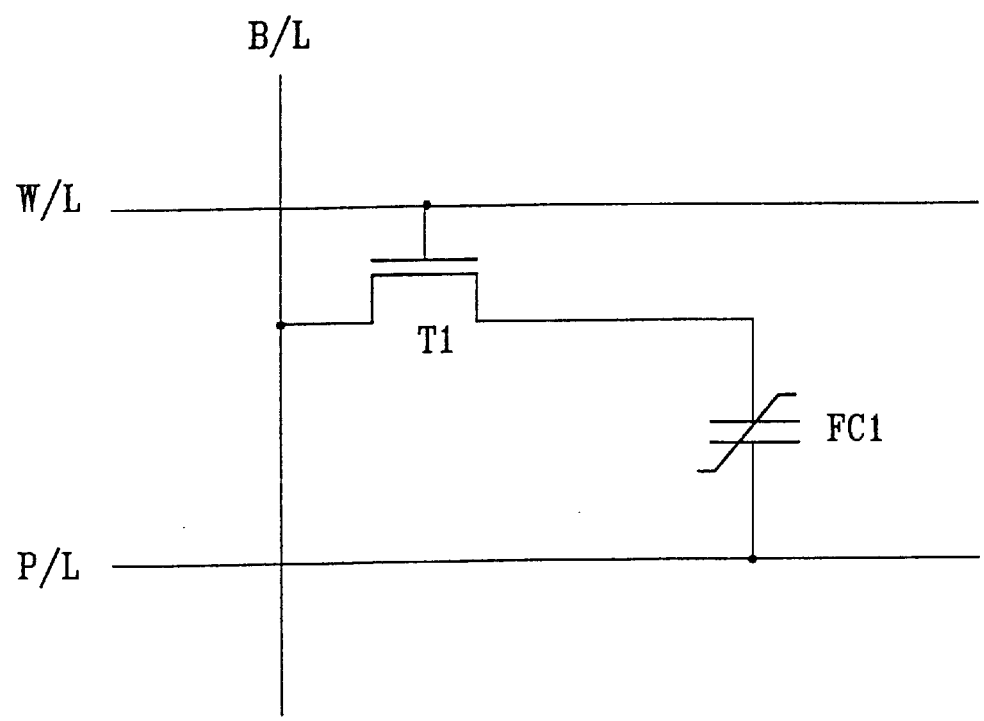
FIG. 2 is a schematic diagram of a unit cell of a related art nonvolatile ferroelectric memory.
Figure 3A:
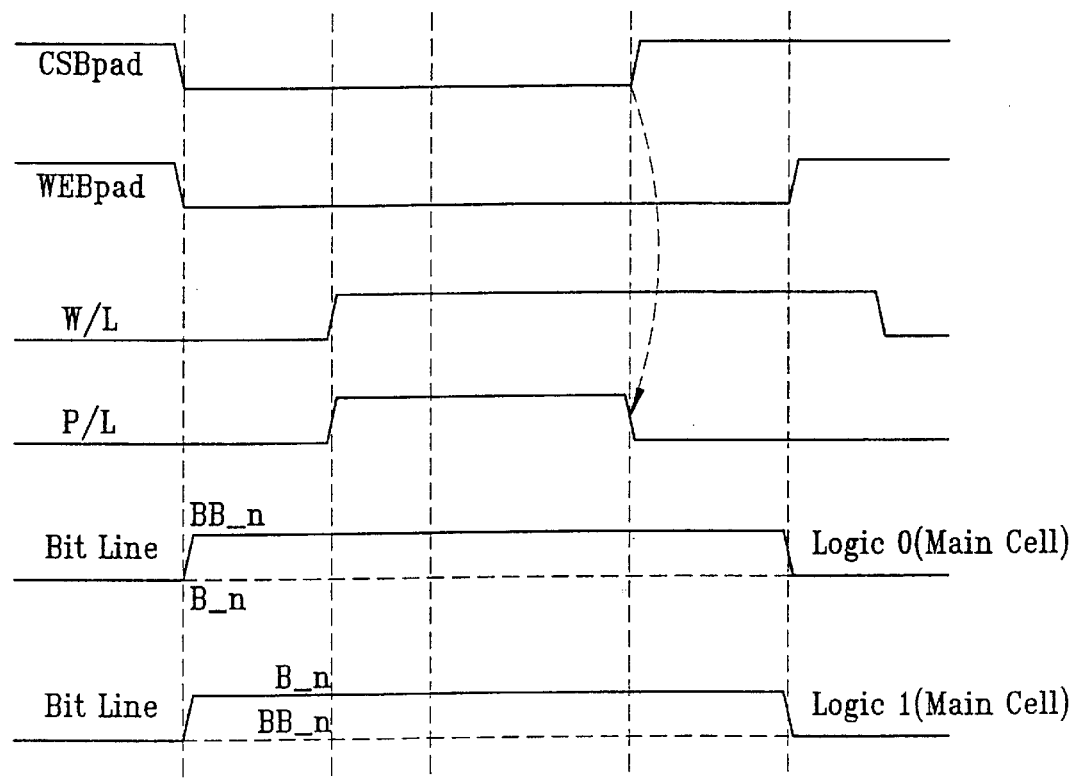
FIG. 3a is a timing chart illustrating the operation of a write mode of the related art nonvolatile ferroelectric memory device.
Figure 3B:
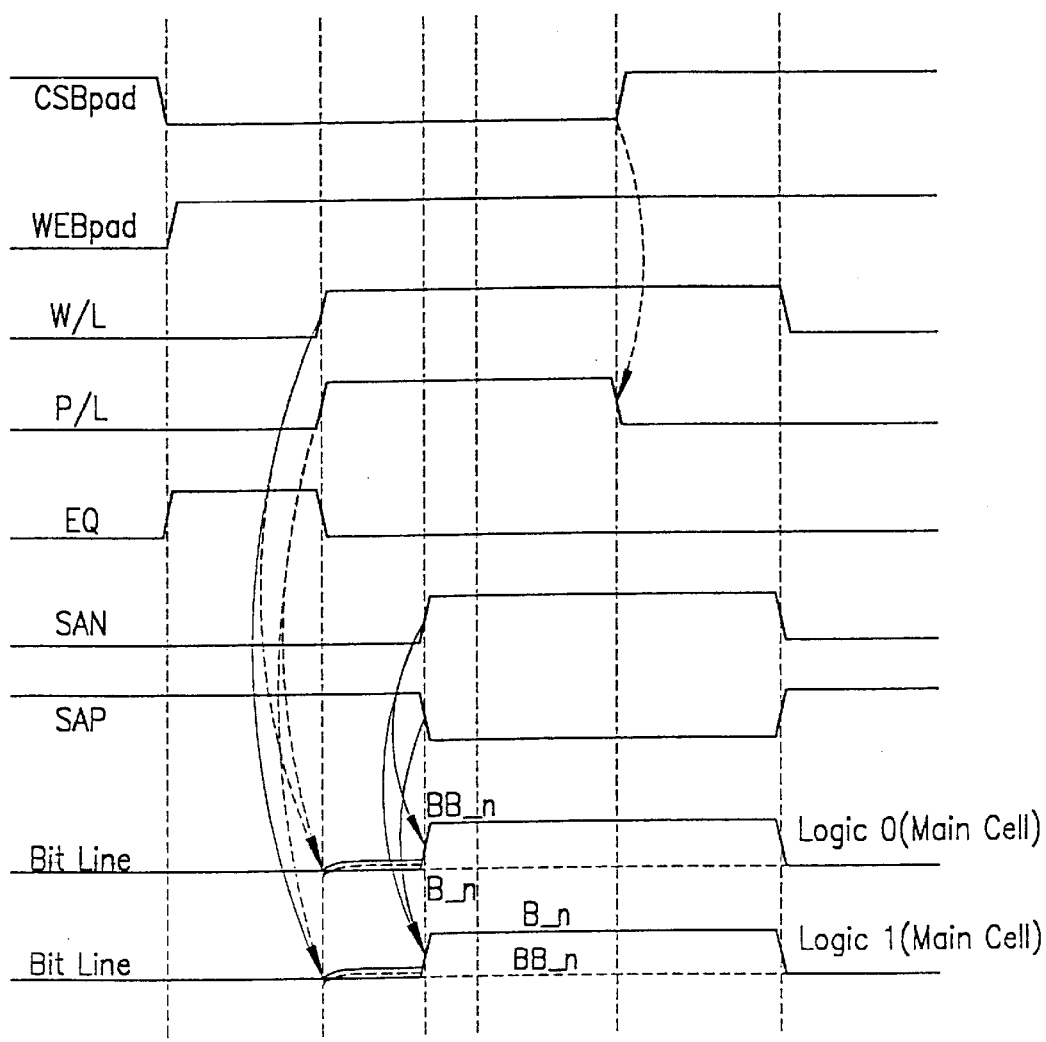
FIG. 3b is a timing chart illustrating the operation of a read mode of the related art nonvolatile ferroelectric memory device.
Figure 4:
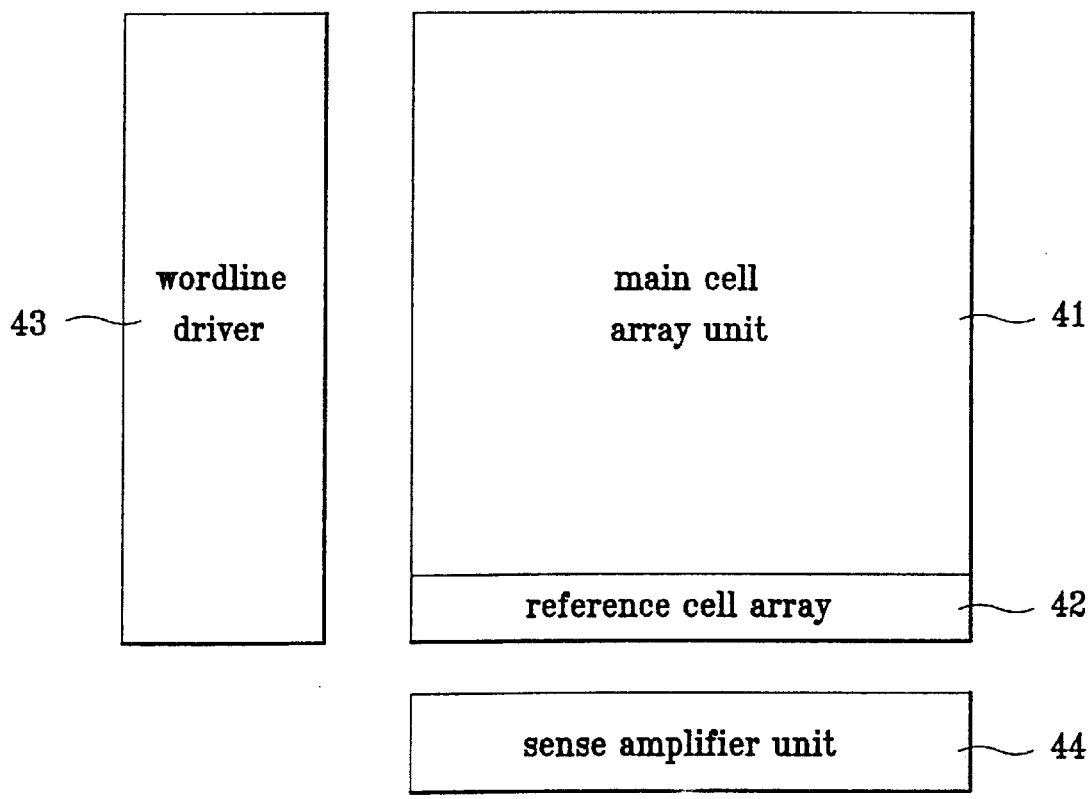
FIG. 4 is a block diagram of the related art nonvolatile ferroelectric memory device.
Figure 5:
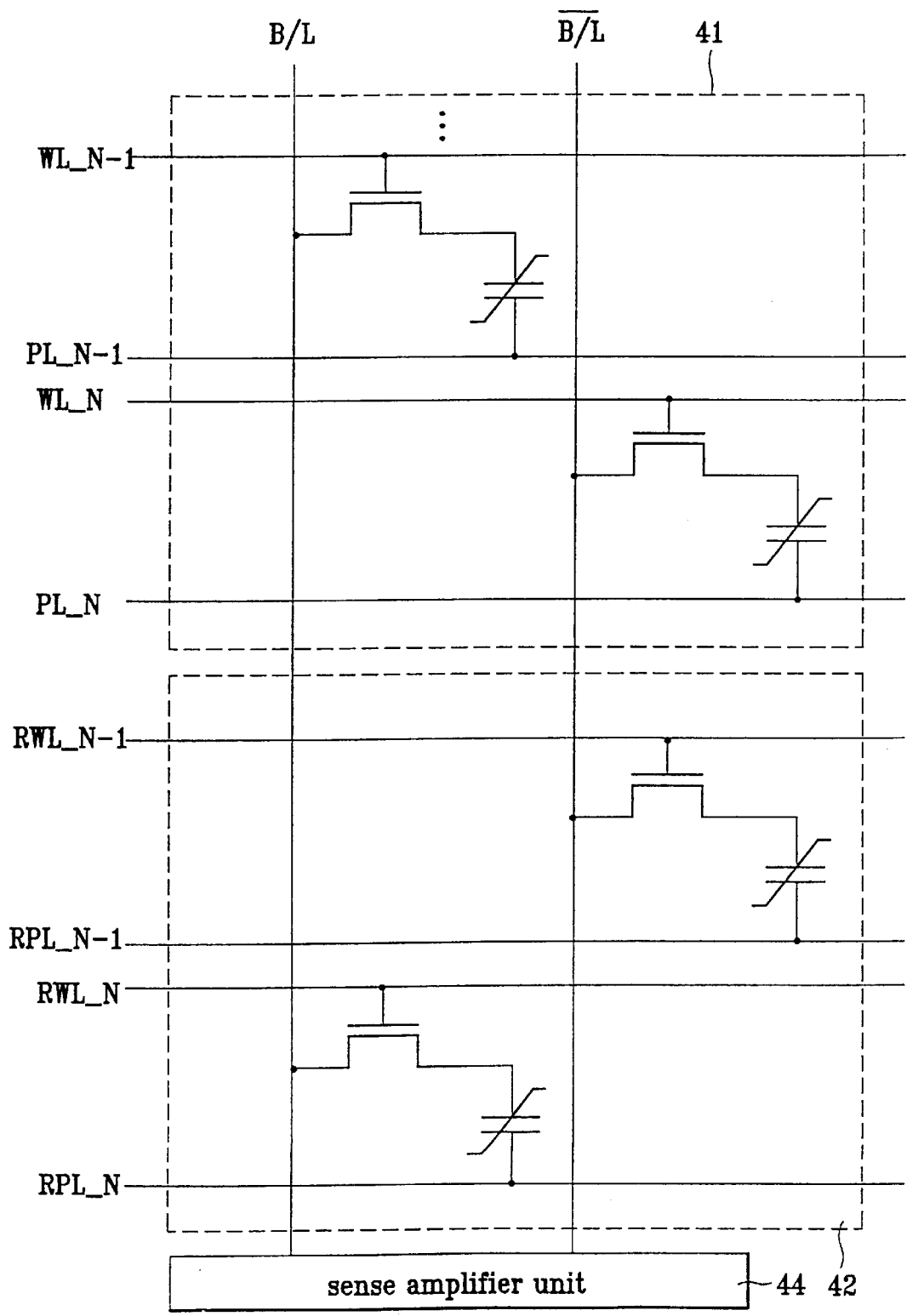
FIG. 5 is a diagram of a partially detailed view of FIG. 4.
Figure 6:
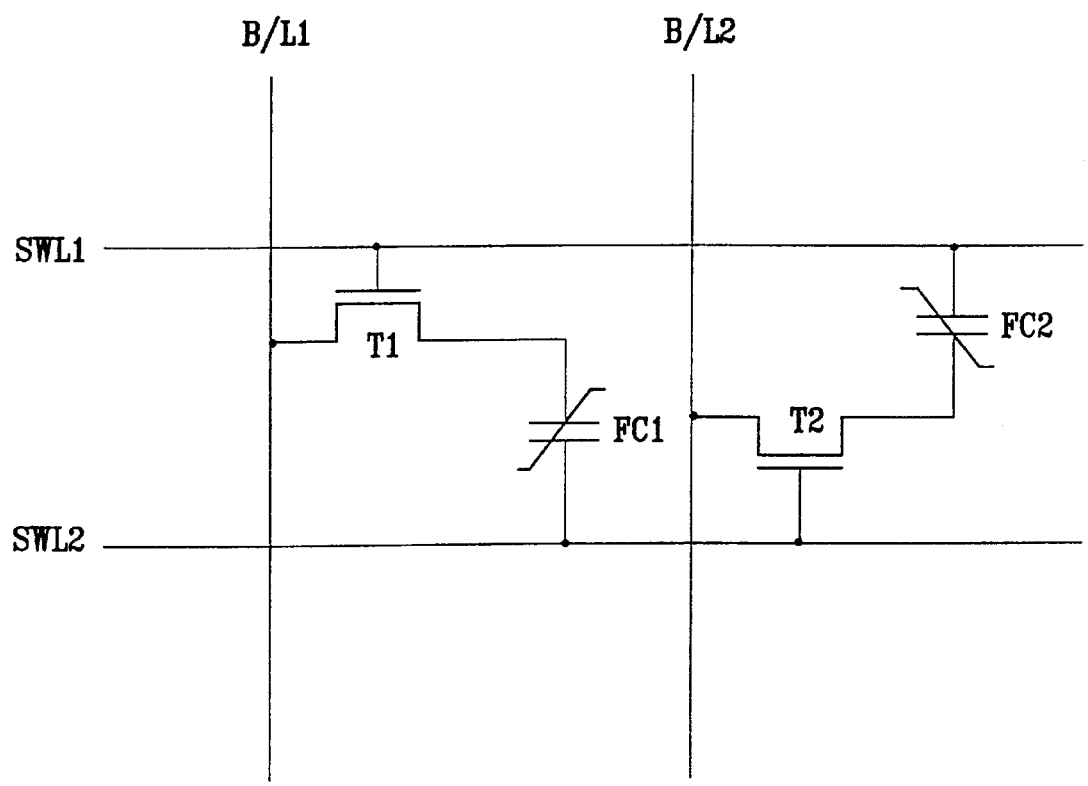
FIG. 6 is a schematic diagram showing a unit cell of a nonvolatile ferroelectric memory device according to preferred embodiments of the present invention.

FIG. 6 is a schematic view showing a unit cell of a nonvolatile ferroelectric memory device according to preferred embodiments of the present invention. As shown in FIG. 6, a unit cell of the nonvolatile ferroelectric memory device has a 1T/1C structure that includes first and second split wordlines SWL1 and SWL2 formed with a prescribed interval in a row direction, and first and second bitlines B/L1 and B/L2 formed across the first and second split wordlines SWL1 and SWL2. A first transistor T1 has a gate coupled with the first split wordline SWL1 and drain coupled with the first bitline B/L1. A first ferroelectric capacitor FC1 is coupled between a source of the first transistor T1 and the second split wordline SWL2. A second transistor T2 has a gate coupled with the second split wordline SWL2 and drain coupled with the second bitline B/L2, and a second ferroelectric capacitor FC2 is coupled between a source of the second transistor T2 and the first split wordline SWL1. A plurality of the unit cells constitute a cell array.

In view of data storage, the unit cell can include a pair of split wordlines, a bitline, a transistor 1T, and a ferroelectric capacitor 1C. A pair of split wordlines, two bitlines, two transistors 2T, and two ferroelectric capacitors 2C form a unit cell in view of structure.

Figure 7:
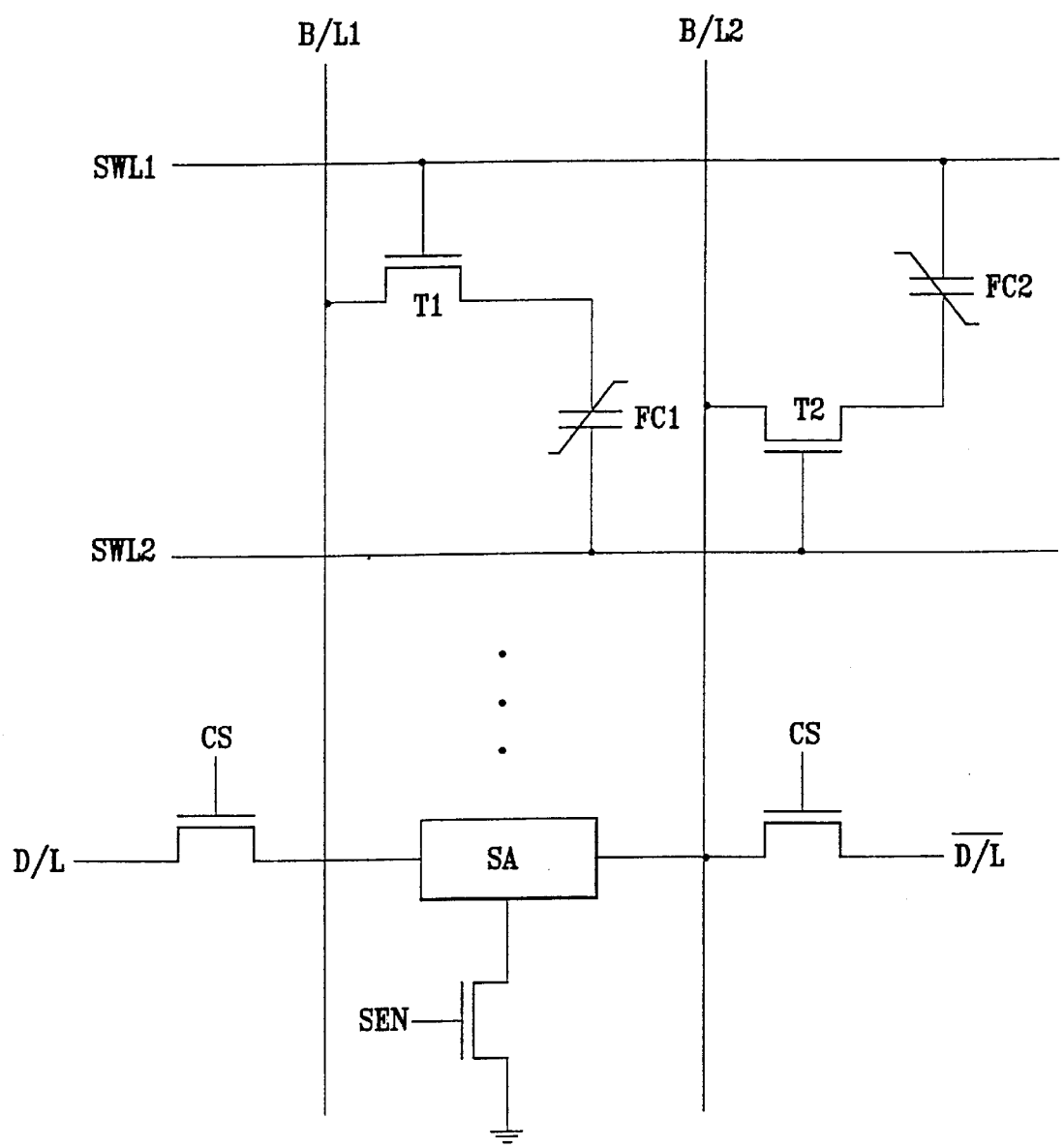
FIG. 7 is a circuit diagram showing a nonvolatile ferroelectric memory device according to preferred embodiments of the present invention.

Operations of the nonvolatile ferroelectric memory device will now be described. FIG. 7 is a circuit diagram showing the nonvolatile ferroelectric memory device according to preferred embodiments of the present invention.

As shown in FIG. 7, a plurality of split wordline pairs including first and second split wordlines SWL1 and SWL2 in pairs are preferably formed in row direction. A plurality of bitlines B/L1 and B/L2 (i.e., B/Ln and B/Ln+1) are formed across the split wordline pairs. Sense amplifier SA is formed between the respective bitlines to sense data transmitted through the bitlines and transfer the sensed data to a data line DL or a data bar line /DL. A sensing amplifier enable unit outputs a sensing amplifier enable signal SEN to enable the sensing amplifiers SA, and a selection switch CS selectively switches bitlines and data lines.

Operations of a nonvolatile ferroelectric memory device according to preferred embodiments of the present invention will be described with reference to a timing chart shown in FIG. 8.

Figure 8:
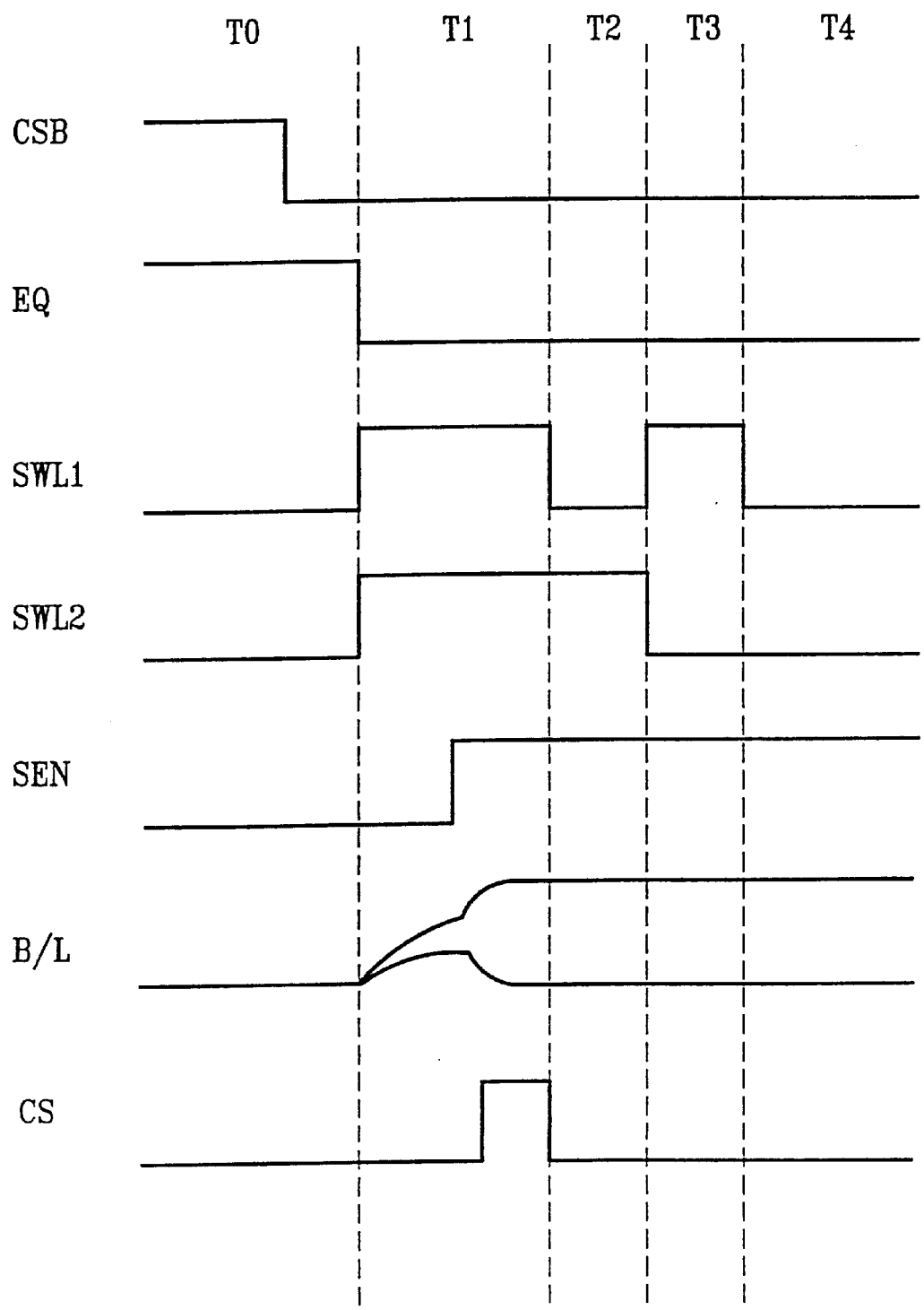
FIG. 8 is a timing chart showing operations of a nonvolatile ferroelectric memory device according to preferred embodiments of the present invention.

A T0 period in FIG. 8 denotes a period before the first split wordline SWL1 and the second split wordline SWL2 are activated to "high(H)". In this T0 period, all of bitlines are preferably precharged at a threshold voltage level of an NMOS transistor.

A T1 period denotes a period that the first and second split wordlines SWL1 and SWL2 are all to become "H". In this T1 period, data of the ferroelectric capacitor in the main cell are transmitted to the main bitline so that the bitline level is varied. to At this time, in case of the ferroelectric capacitor having a logic value "high", since electric fields having opposite polarities are applied to the bitline and the split wordline, the polarity of the ferroelectric is destroyed so that a large amount of current flows. Thus, a high voltage in the bitline is induced. By contrast, in case of the ferroelectric capacitor having a logic value "low", since electric fields having the same polarities are applied to the bitline and the split wordline, polarity of the ferroelectric is not destroyed so that a small amount of current flows. Thus, a low voltage is induced in the bitline.

If the cell data are loaded in the bitline sufficiently, the sensing amplifier enable signal SEN is transited to high so as to activate the sensing amplifier. As a result, the bitline level is amplified.

Since the logic data "H" of the destroyed cell can not be restored at the state that the first and second split wordlines SWL1 and SWL2 are high, the data can be restored in T2 and T3 periods. Subsequently, in T2 period, the first split wordline SWL1 is transited to low, the second split wordline SWL2 is maintained at high level, and the second transistor T2 is turned on. At this time, if the corresponding bitline is high, high data is transmitted to one electrode of the second ferroelectric capacitor FC2 so that the logic value "1" is restored between the low level of the first split wordline SWL1 and a high level of the bitline.

In T3 period, the first split wordline SWL1 is transited to high, the second split wordline SWL2 is transited to low, and the first transistor T1 is turned on. At this time, if the corresponding bitline is high, high data is transmitted to one electrode of the first ferroelectric capacitor FC1 so that logic value "1" is restored.

Figure 9:
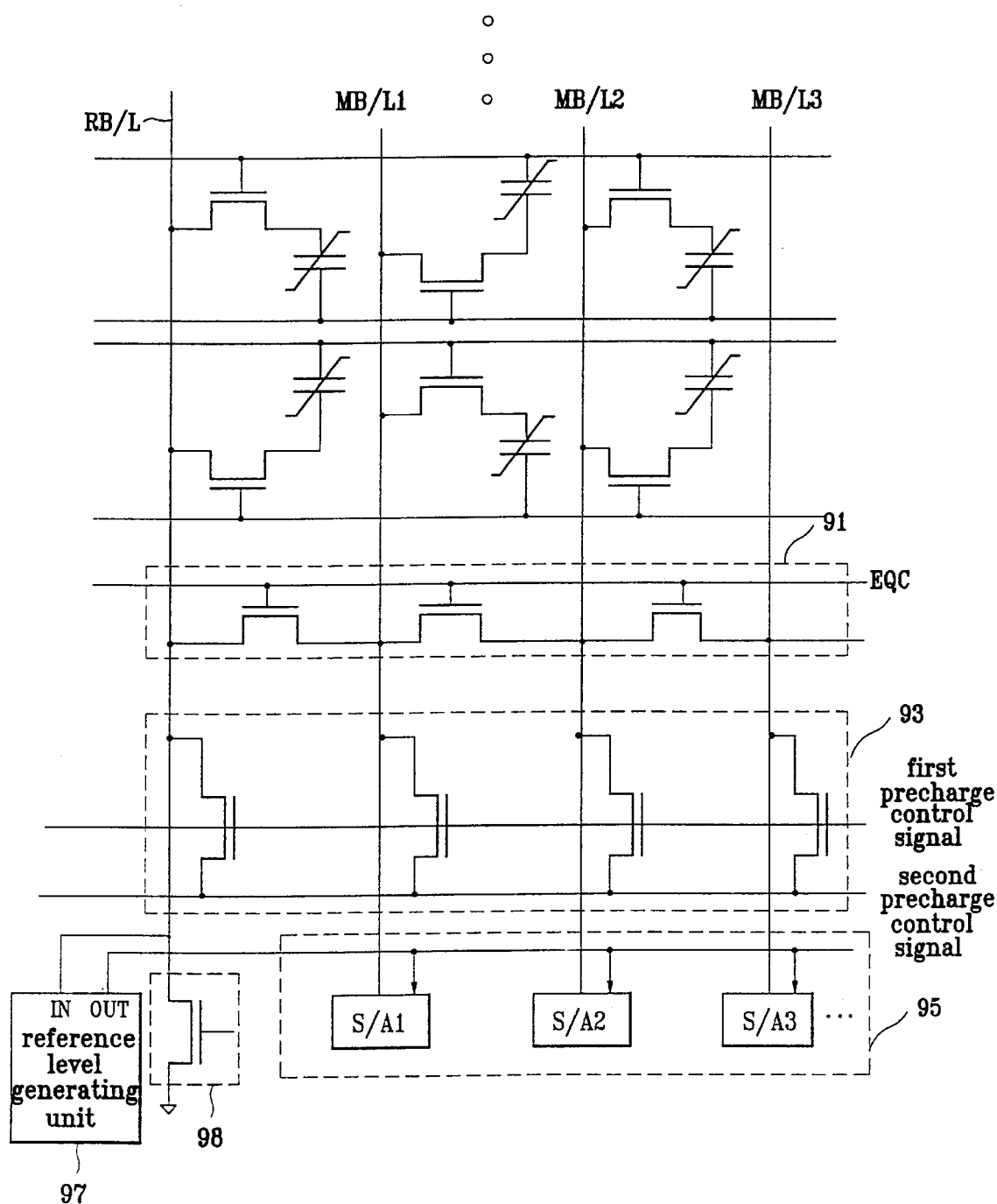
FIG. 9 is a diagram that illustrates a preferred embodiment of a nonvolatile ferroelectric memory in accordance with the present invention.

FIG. 9 is a diagram that illustrates a circuit of a nonvolatile ferroelectric memory in accordance with a first preferred embodiment of the present invention. In the first preferred embodiment, a sense amplifier unit is provided only on one side and preferably under the cell array unit.

As shown in FIG. 9, the nonvolatile ferroelectric memory in accordance with the first preferred embodiment includes at least one reference bitline RB/L, a plurality of main bitlines MB/L1, MB/L2, MB/L3, . . . on one side of the reference bitline, an equalizing unit 91 having equalizers for equalizing adjacent bitlines among the bitlines, and a precharge level adjusting unit 93 having NMOS transistors coupled to respective bitlines each for adjusting a precharge level of the bitline in response to a combination of a first precharge control signal and a second precharge control signal. A sense amplifier unit 95 has sense amplifiers S/A1, S/A2, . . . , S/An each coupled to a corresponding one of the main bitlines for sensing a signal on the bitline, and a reference level generating unit 97 receives and amplifies the reference bitline signal. The reference level generating unit 97 preferably forwards the reference bitline signal as a reference voltage for the sense amplifiers. Each of the NMOS transistors in the precharge level adjusting unit 93 has a gate that receives a first precharge control signal, and a drain that receives a second precharge control signal. Sources of the NMOS transistors in the precharge level adjusting unit 93 are coupled to a corresponding bitline. A level of the first precharge control signal is preferably 3Vtn, and a level of the second precharge control signal is preferably Vtn. Accordingly, the source receives a 2Vtn level when the first precharge control signal of 3Vtn is applied to the gate and the second precharge control signal of Vtn is applied to the drain to precharge each of the bitlines to 2Vtn. Reference cells are coupled to a reference bitline, and main cells are coupled to a main bitline. In order to store logic "0" always in the reference cell, a pull down unit 98 operative in response to the reference bitline control signal is used for pulling down the reference bitline during a restoring period. The equalizers for equalizing adjacent bitlines are operative in response to an equalize control signal (EQC) to equalize the bitlines and the reference bitlines on the same time.

Figure 10:
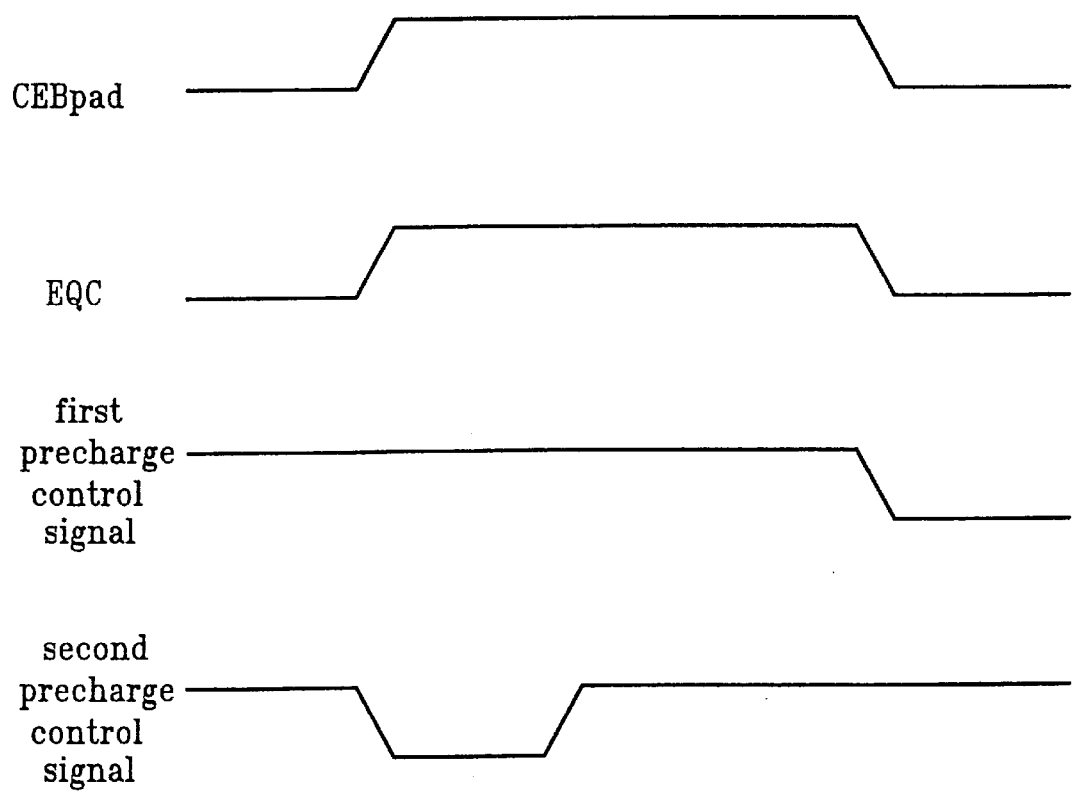
FIG. 10 is a diagram that illustrates timing waveforms in the nonvolatile ferroelectric memory in accordance with a preferred embodiment of the present invention.

Operations of the first preferred embodiment of a nonvolatile ferroelectric memory according to the present invention will now be described. As shown in FIG. 10, when the chip enable signal CEBpad is disabled to high, the equalize control signal (EQC) is transited from low to high. The high level EQC enables the equalizer unit 91, which is preferably controlled by the equalize control signal, to equalize the main bitlines and the reference bitlines at the same time. Being held at a 3Vtn level during a precharge period, the first precharge control signal is transited to low to finish the precharging operation when the CEBpad signal is enabled to low. Since the precharge level adjusting unit 93 is in an enabled state by the first precharge control signal, if the second precharge signal is pulled-down from high to low, the main bitline and the reference bitline are also pulled-down to a ground level. When the second precharge control signal is transited from low to high again, since the gates of the NMOS transistors in the precharge level adjusting unit 93 are held at 3Vtn of the first precharge control signal, even if the second precharge control signal provided to the drains is at a high level of a Vcc level, a voltage of a 2Vtn (e.g., =3Vtn−Vtn) level is provided to the main bitlines and the reference bitlines both coupled to the sources to precharge the main bitlines and the reference bitlines. The first precharge control signal, which is preferably generated in a precharge supply signal generating unit (not shown), is provided to the precharge level adjusting unit 93 through a precharge control signal selecting and forwarding unit (not shown). That is, preferably only one from a plurality of sub-cell arrays in the main cell array is selected. In other words, the precharge control signal selecting and forwarding unit for determining application of the first precharge signal preferably generated in the precharge supply signal generating unit corresponding to its precharge level adjusting unit is selectively provided to every sub-cell array.

Figure 11:
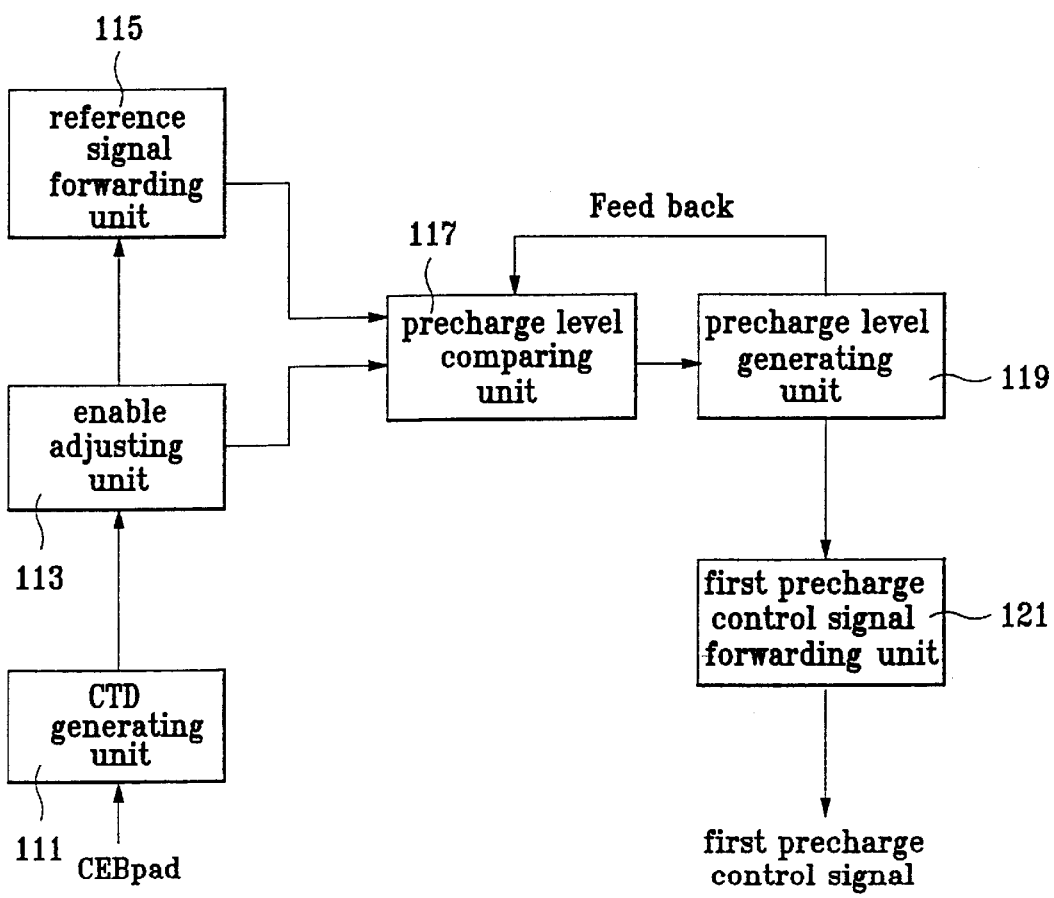
FIG. 11 is a block diagram that illustrates a preferred embodiment of a precharge supply signal generating unit in accordance with the present invention.

FIG. 11 is a block diagram showing a preferred embodiment of a precharge supply signal generating unit according to the present invention. The preferred embodiment of the precharge supply generating unit can operate and will be described in reference to the first preferred embodiment of the nonvolatile ferroelectric memory in accordance with the present invention. As shown in FIG. 11, the precharge supply signal generating unit includes a CTD generating unit 111 for generating a CEB Transition Detection (CTD) signal, an enable adjusting unit 113 for receiving the CTD signal from the CTD generating unit 111 and providing a first enable signal and a second enable signal and a reference signal forwarding unit 115 for receiving the first enable signal to provide a reference signal for producing a precharge level. A precharge level comparing unit 117 is for receiving the second enable signal and comparing the reference signal from the reference signal forwarding unit 115 to a feedback signal. A precharge level generating unit 119 is adapted to receive a driving signal from the precharge level comparing unit 117 for feeding its own signal back to the precharge level comparing unit 117 until the driving signal from the precharge level comparing unit 117 informs that a level of the feedback signal is a level of the reference signal. Then, the precharge level generating unit 119 is disabled. A first precharge control signal forwarding unit 121 is for receiving a signal from the precharge level generating unit 119 to provide the first precharge control signal. In this instance, if the level of the feedback signal from the precharge level generating unit 119 is lower than the level of the reference signal from the reference signal forwarding unit 115, the precharge level comparing unit 117 preferably enables the precharge level generating unit 119 until the level of the feedback signal is higher than the level of the reference signal. Further, the reference signal of a 3Vtn level from the reference signal forwarding unit 115 is not a signal used as a reference signal for the sense amplifier, but a reference signal for generating the first precharge control signal. The reference signal for the sense amplifier is provided by the reference level generating unit as described below.

Figure 12:
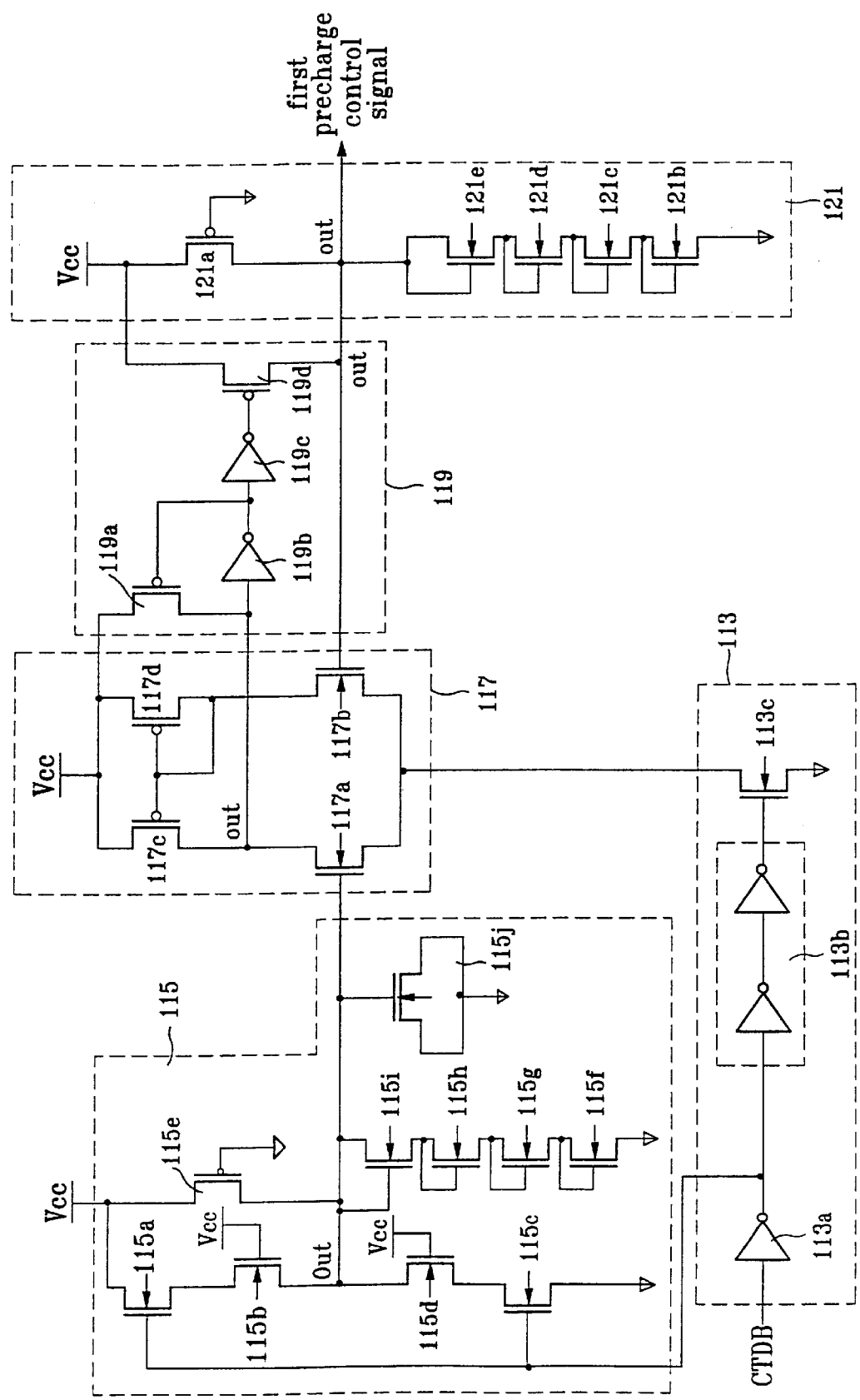
FIG. 12 is a schematic diagram that illustrates a circuit of a precharge supply signal generating unit of FIG. 11.

FIG. 12 is a diagram that illustrates a circuit of a precharge supply signal generating unit in FIG. 11. As shown in FIG. 12, the precharge supply signal generating unit includes the enable adjusting unit 113, the reference signal forwarding unit 115, the precharge level comparing unit 117, the precharge level generating unit 119 and the precharge control signal forwarding unit 121. The enable adjusting unit 113 includes a first inverter 113a for inverting a low level CTD signal CTDB, which is forwarded as a first enable signal for enabling the reference signal forwarding unit 115. A first buffer unit 113b is for buffering a signal from the first invertor 113a for a preset time, and a first transistor 113c is for determining application of the second enable signal to the precharge level comparing unit 117 in response to a signal from the first buffer unit 113b. The buffer unit 113b preferably has two invertors coupled in series, and the first transistor 113c is an n-channel enhancement transistor.

The reference signal forwarding unit 115 includes a first transistor 115a having a gate for receiving the first enable signal for switching a power source voltage Vcc, a second transistor 115b having a gate for receiving the power source voltage Vcc, a drain coupled to a source of the first transistor 115a, and a source coupled to an output terminal Out. A third transistor 115c has a gate for receiving the first enable signal to switch a ground voltage and a fourth transistor 115d has a gate for receiving the power source voltage Vcc, a drain coupled to a source of the third transistor 115c, and a source coupled to the output terminal Out together with a source of the second transistor 115b. A fifth transistor 115e has a gate for receiving a ground voltage, a drain for receiving the power source voltage Vcc, and a source coupled to the output terminal Out. A sixth transistor 115f has a drain coupled to the ground terminal and a gate and a source coupled together, a seventh transistor 115g has a drain coupled to a source of the sixth transistor 115f and a gate and a source coupled together, and an eighth transistor 115h has a drain coupled to a source of the seventh transistor 115g and a gate and a source coupled together. A ninth transistor 115i has a drain coupled to a source of the eighth transistor 115h and a gate and a source coupled together to the output terminal Out. An output voltage stabilizing unit 115j is for stabilizing a voltage on the output terminal Out. Preferably the output voltage stabilizing unit 115j includes an MOS capacitor, the fifth transistor 115e is a PMOS transistor, and the other transistors are n-channel enhancement transistors. The voltage on the output terminal Out is preferably regulated to be 3Vtn by a voltage ratio of the fifth transistor 115e to the sixth, seventh, eighth, and ninth transistors 115f, 115g, 115h, and 115i. Accordingly, a 4Vtn from the four NMOS transistors and the Vtn from the fifth transistor 115e produce the output terminal level of 3Vtn (e.g., 4Vtn−Vtn). The output terminal Out is provided with a stable output signal by the output voltage stabilizing unit 115j having an MOS capacitor, which is then forwarded to the precharge level comparing unit 117.

The precharge level comparing unit 117 includes a first transistor 117a having a gate for receiving a signal from the reference signal forwarding unit 115, and a drain for receiving the second enable signal from the enable adjusting unit 113 and a second transistor 117b having a gate for receiving a signal fed back from the precharge level generating unit 119, and a drain for receiving the second enable signal. A third transistor 117c has a drain for receiving a power source voltage Vcc, a source coupled to an output terminal Out together with a source of the first transistor 117a to switch the power source voltage in response to a gate voltage, and a fourth transistor 117d having a drain for receiving the power source voltage Vcc, a gate and a source coupled together and to a source of the second transistor 117b. The precharge level comparing unit 117 compares the 3Vtn level from the reference signal forwarding unit 115 and the feedback signal, to provide a driving signal if the feedback signal has a level lower than the 3Vtn, for example. The driving signal enables the precharge level generating unit 119 to provide a greater or increased power when the feedback signal has a level lower than 3Vtn. If a level of the feedback signal is higher than at least 3Vtn, the precharge level comparing unit 117 disables the precharge level generating unit 119. Preferably, the first and second transistors 117a and 117b are n-channel enhancement transistors, and the third and fourth transistors 117c and 117d are PMOS transistors.

The precharge level generating unit 119 includes a first transistor 119a coupled between the output terminal Out on the precharge level comparing unit 117 and the power source terminal Vcc, a first inverter 119b for inverting a signal from the precharge level comparing unit 117, and a second inverter 119c for inverting a signal from the first inverter 119b. A second transistor 119d has a gate for receiving a signal from the second inverter 119c, a drain for receiving a power source voltage Vcc, and a source coupled to an output terminal Out as well as to a gate of the second transistor 117b in the precharge level comparing unit 117. A signal from the first inverter 119b is provided to a gate of the first transistor 119a, and the first inverter 119b and the second inverter 119c are coupled in series for serving as a buffer. Preferably, the first and second transistors 119a and 119d are PMOS transistors.

The first precharge control signal forwarding unit 121 receives a precharge supply signal from the precharge level generating unit 119 and provides a first precharge control signal. The precharge level generating unit 119 is for maintaining the first precharge control signal stable. The first precharge control signal forwarding unit 121 includes a first transistor 121a having a gate for receiving a ground voltage and coupled between a power source terminal Vcc and the output terminal Out on the precharge level generating unit 119. A second transistor 121b has a drain coupled to a ground terminal Vss and a gate and a source coupled together. A third transistor 121c has a drain coupled to a source of the second transistor 121b, and a gate and a source coupled together. A fourth transistor 121d has a drain coupled to a source of the third transistor 121c, and a gate and a source coupled together. A fifth transistor 121e has a drain coupled to a source of the fourth transistor 121d, and a gate and a source coupled together to the output terminal Out. Preferably, the first transistor 121a is a PMOS transistor, and the other transistors are n-channel enhancement transistors.

Figure 13:
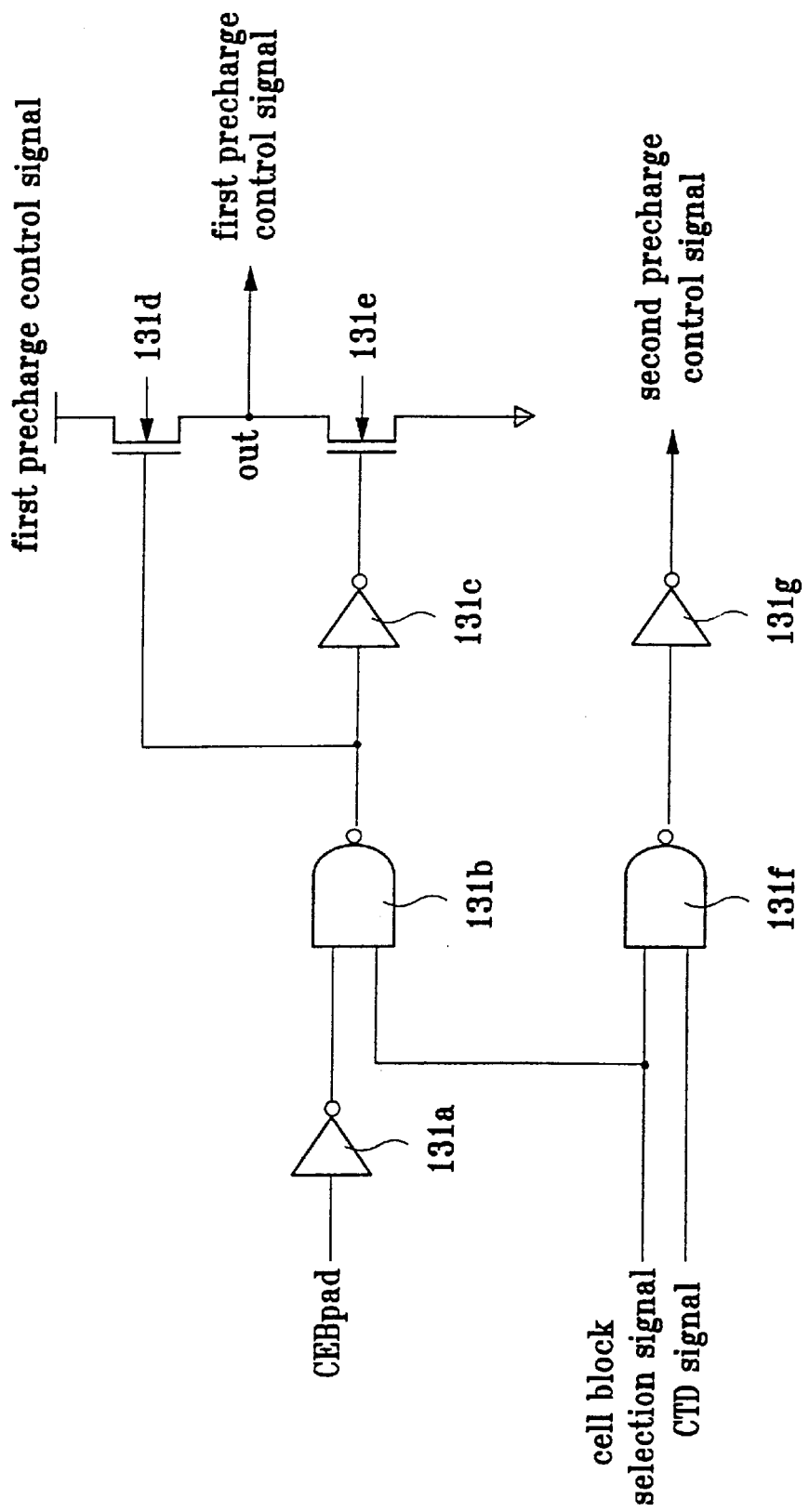
FIG. 13 is a schematic diagram that illustrates an exemplary precharge control signal selecting and forwarding unit in accordance with a preferred embodiment of the present invention.

FIG. 13 is a diagram that illustrates an exemplary precharge control signal selecting and forwarding unit in accordance with the first preferred embodiment of the nonvolatile ferroelectric memory. As shown in FIG. 13, the precharge control signal selecting and forwarding unit is provided for selectively forwarding the first precharge control signal from the precharge supply signal generating unit to a relevant cell block. That is, the main cell array unit has a plurality of sub cell array units, and the first precharge control signal from the precharge supply signal generating unit is forwarded, not to all of the sub cell array units, but preferably to only at least one selected sub cell array unit. Therefore, a precharge control signal selecting and forwarding unit is provided for every sub cell array unit for selectively forwarding the first precharge control signal to a relevant sub cell array unit. An exemplary precharge control signal selecting and forwarding unit includes two logical devices, three invertors, and two transistors. That is, the precharge control signal selecting and forwarding unit in FIG. 13 includes an NAND gate 131b for subjecting a signal inverted from the CEBpad signal by the first inverter 131a and a cell block selection signal to a logical operation and a second inverter 131c for inverting a signal from the first NAND gate 131b. A first NMOS transistor 131d has a drain for receiving the first precharge control signal from the first precharge control signal forwarding unit 121 and is adapted to be turned on/off in response to a signal from the first NAND gate 131b. A second transistor 131e has a drain coupled to a ground terminal, a source coupled to an output terminal Out and adapted to be turned on/off in response to a signal from the second inverter 131c. A second NAND gate 131f is for subjecting the cell block selection signal and the CTD signal to a logical operation, and a third inverter 131g is for inverting a signal from the second NAND gate 131f. The precharge control signal selecting and forwarding unit determines application of the first precharge control signal to a relevant precharge level adjusting unit through the output terminal Out in response to the CEB signal and the cell block selection signal. The signal from the third inverter 131g is the second precharge control signal, of which level of being Vtn or low is determined in response to the cell block selection signal and the CTD signal.

Figure 14:
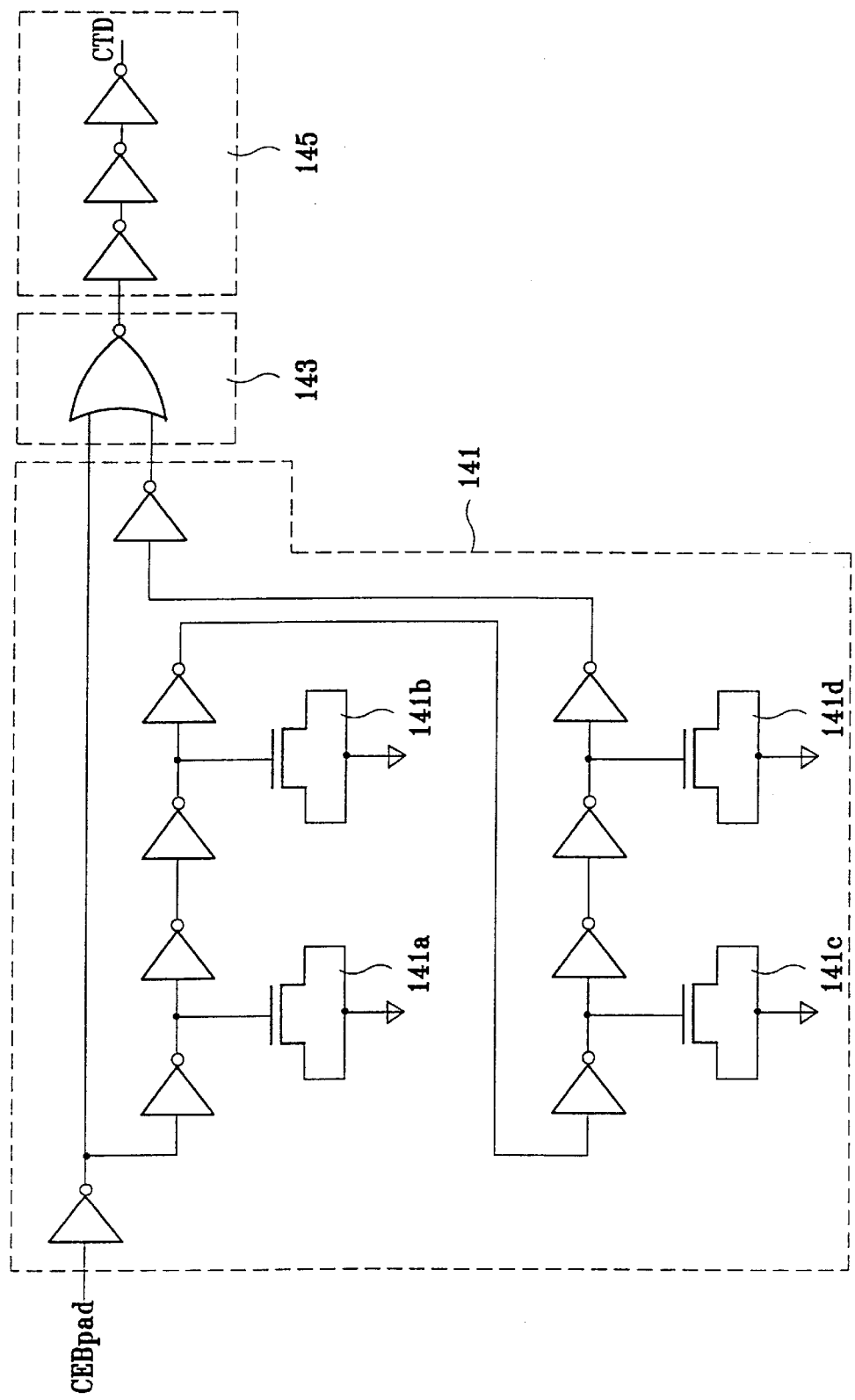
FIG. 14 is a schematic diagram that illustrates an exemplary CTD generating unit in accordance with a preferred embodiment of the present invention.

FIG. 14 is a diagram that shows an exemplary CTD generating unit for detecting disable state of the CEBpad signal to generate the CTD signal. As shown in FIG. 14, the CTD generating unit 111 according to the first preferred embodiment of the nonvolatile ferroelectric memory array of the present invention includes a pulse width adjusting and delay unit 141, a pulse width generating unit 143 and a driving unit 145. The pulse width adjusting and delay unit 141 includes a delay unit having an even number of invertors coupled in series each for delaying the CEBpad signal for a time period, and MOS capacitors 141a, 141b, 141c, and 141d each coupled to an output terminal on each (k+1)th inverter (k=1,3,5, . . . ) for stabilizing a signal from the corresponding inverter. The pulse width generating unit 143 includes a logic gate for subjecting outputs from the first invertor and the last inverter to a logical operation to adjust a width of an output signal. The driving unit 145 includes invertors each for inverting an output of the pulse width generating unit 143.

Operations of the precharge supply signal generating unit in the first embodiment nonvolatile ferroelectric memory of the present invention will now be described. When a CEBpad signal, a chip enable signal, is disabled from low to high, the CTD generating unit 111 senses it and provides a CTD signal. The CTD signal is a low pulse that is held at low for a time period and transited to high, again. While the CTD signal is a low pulse, the enable adjusting unit 113 provides a first enable signal and a second enable signal. The first enable signal controls an enabling of the reference signal forwarding unit 115. That is, the first enable signal enables the reference signal forwarding unit 115 to provide a reference signal of 3Vtn level to the precharge level comparing unit 117. The second enable signal controls an enabling of the precharge level comparing unit 117. The precharge level comparing unit 117 is enabled for comparing a feedback signal to a signal from the reference signal forwarding unit 115. In this instance, if a level of the feedback signal is lower than a level of the reference signal, a driving signal is generated by the precharge level comparing unit 117 to enable the precharge level generating unit 119, which provides a feedback signal, for pulling up an output of the signal. The pulled up feedback signal is returned to the precharge level comparing unit 117 and again compared to the reference signal. The process is repeated until a level of a signal from the precharge level generating unit 119 is higher than a level of the reference signal. At this point, the precharge level comparing unit 117 disables the precharge level generating unit 119. Thus, the precharge level generating unit 119 can provide an appropriate precharge supply signal, and the first precharge control signal generating unit 121 provides the first precharge control signal in response to the precharge supply signal.

Figure 15:
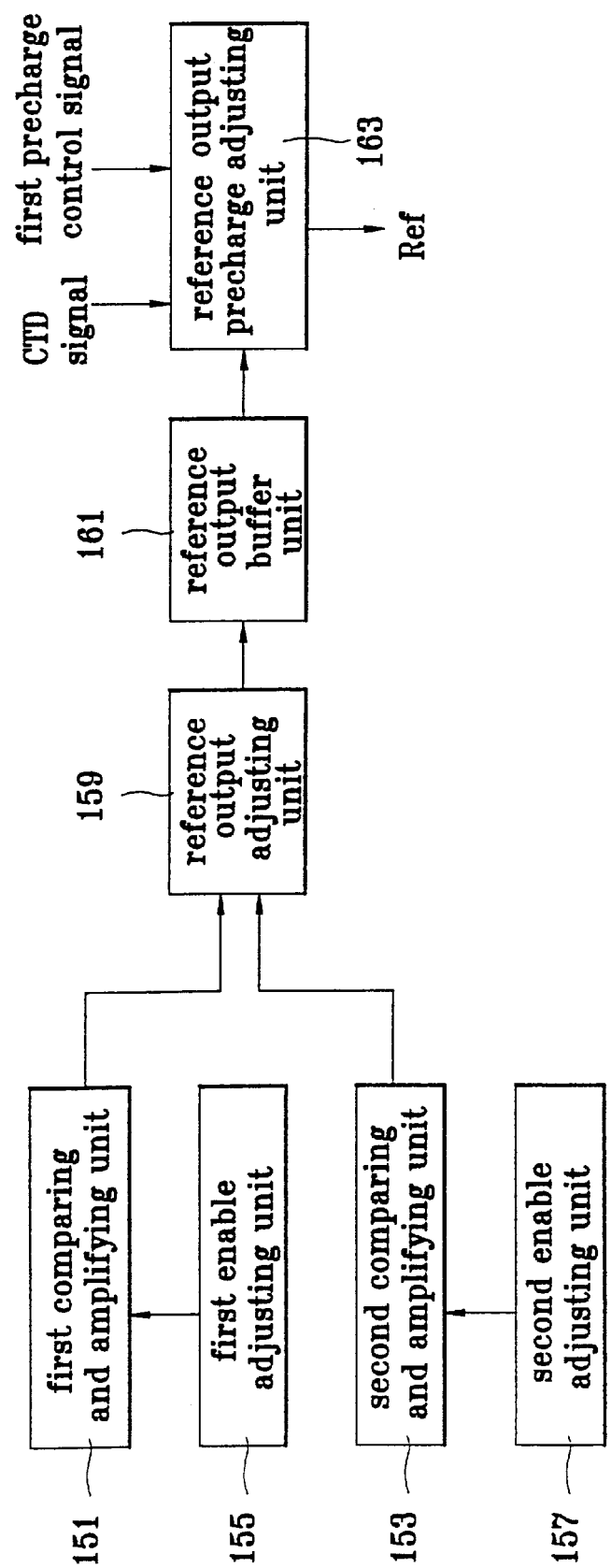
FIG. 15 illustrates a block diagram showing a preferred embodiment of a reference level generating unit in accordance with the present invention.

FIG. 15 is a diagram that illustrates a block diagram of a preferred embodiment of a reference level generating unit, which can be used in a nonvolatile ferroelectric memory in accordance with the first preferred embodiment of the present invention. As shown in FIG. 15, the reference level generating unit includes first and second comparing and amplifying units 151 and 153 each for comparing a reference signal from a corresponding reference bitline to a signal fed back thereto and amplifying the signal. A first enable adjusting unit 155 is for determining enabling of the first comparing and amplifying unit 151, and a second enable adjusting unit 157 is for determining enabling of the second comparing and amplifying unit 153. A reference output adjusting unit 159 adjusts a level of the reference signal in response to signals from the first comparing and amplifying unit 151 and the second comparing and amplifying unit 153. A reference output buffer unit 161 buffers the adjusted reference signal, and a reference bitline precharge adjusting unit 163 adjusts a precharge level of the reference bitline to a precharge level of the main bitline in response to the first precharge control signal.

Figure 16:
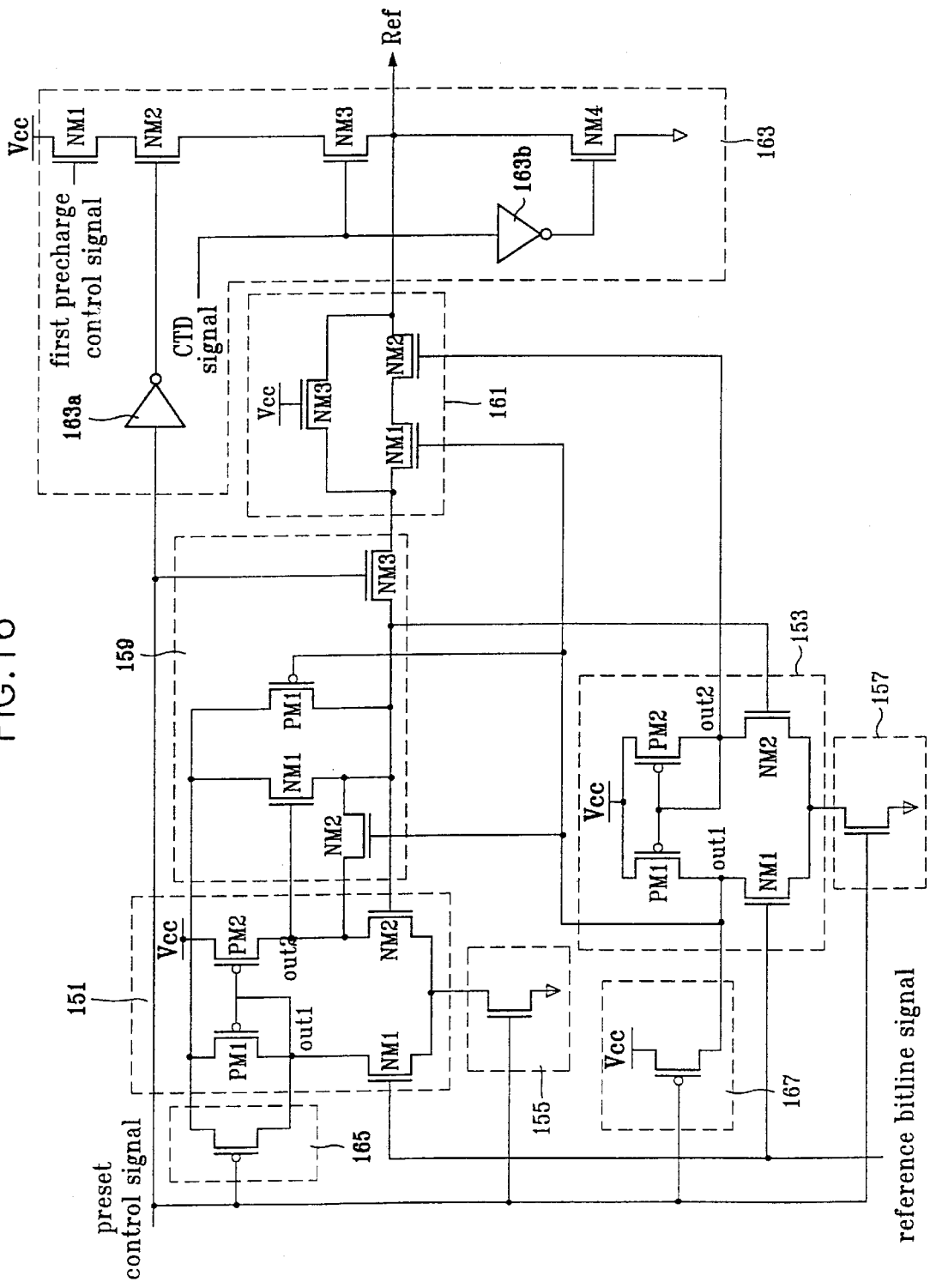
FIG. 16 is a schematic diagram that illustrates a circuit of a reference level generating unit of FIG. 15; and to FIG. 17 is a diagram that illustrates another preferred embodiment of a nonvolatile ferroelectric memory in accordance with the present invention.

FIG. 16 is a schematic diagram that illustrates a circuit of the reference level generating unit shown in FIG. 15 where the first comparing and amplifying unit is a current mirror type differential amplifier, which includes two PMOS transistors and two NMOS transistors. The first comparing and amplifying unit 151 adapted to be enabled by the first enable adjusting unit 155 includes a first transistor NM1 having a gate for receiving a signal from the reference bitline, a drain coupled to a drain of the NMOS transistor in the first enable adjusting unit 155, and a source coupled to the first output terminal Out1. A second transistor PM1 is coupled between a first output terminal Out1 and the power source terminal Vcc. A third transistor NM2 has a gate for receiving a signal fed from the reference output adjusting unit 159 back thereto, a drain coupled to the drain of the NMOS transistor in the first enable adjusting unit 155, and a source coupled to a second output terminal Out2. A fourth transistor PM2 is coupled between the power source terminal and the second output terminal Out2 and has a gate coupled to a gate of the second transistor PM1. Preferably, the second transistor and the fourth transistor are PMOS transistors, and the first transistor and the third transistor are NMOS transistors.

A preset control unit 165 is coupled between a source and a drain of the second transistor PM1 in parallel with the second transistor PM1 of the first comparing and amplifying unit 151. The preset control unit preferably includes a PMOS transistor.

Similar to first comparing and amplifying unit 151, the second comparing and amplifying unit 153 is a differential amplifier whose enabling is determined by the second enable adjusting unit 157. That is, the second comparing and amplifying unit 153 includes a first transistor NM1 having a gate for receiving a signal from the reference bitline, a drain coupled to a drain of the NMOS transistor in the second enable adjusting unit 157, and a source coupled to a first output terminal Out1. A second transistor PM1 is coupled between the power source terminal Vcc and the first output terminal Out1 and has a gate and a source coupled together. A third transistor NM2 has a gate for receiving a signal fed from the reference output adjusting unit 159 back thereto, a drain coupled to the drain of the NMOS transistor in the second enable adjusting unit 157, and a source coupled to a second output terminal Out2. A fourth transistor PM2 is coupled between the second output terminal Out2 and the power source terminal and has a gate coupled to a gate of the second transistor PM1. Preferably, the first and third transistors are NMOS transistors, and the second and fourth transistors are PMOS transistors. The second enable adjusting unit 157 is an NMOS transistor having a drain coupled to a ground terminal. A second preset control unit 167 of a PMOS transistor is coupled to the first output terminal Out1 of the second comparing and amplifying unit 153.

The reference output adjusting unit 159 includes a first transistor NM1 coupled in parallel between the drain of the fourth transistor PM2 and a gate of the second transistor NM2 in the first comparing and amplifying unit 151 and has a gate coupled to the second output terminal Out2 on the first comparing and amplifying unit 151. A second transistor NM2 has a drain coupled to the second output terminal Out2 on the first comparing and amplifying unit 151, a source coupled to a source of the first transistor NM1, and a gate coupled to the first output terminal Out1 on the second comparing and amplifying unit 153. A third transistor PM1 has a drain coupled to a drain of the fourth transistor PM2 in the first comparing and amplifying unit 151, a source coupled to the gate of the third transistor NM2 in the first comparing and amplifying unit 151, and a gate coupled to the first output terminal Out1 on the second comparing and amplifying unit 153. A fourth transistor NM3 has a gate for receiving the preset control signal, a drain coupled to a gate of the third transistor NM2 in the second comparing and amplifying unit 153, and a source coupled to an input terminal on the reference output buffer unit 151. Preferably, the first, second and the fourth transistors are NMOS transistors, and the third transistor is a PMOS transistor.

The reference output buffer unit 161 includes first and second transistors NM1 and NM2 coupled in series to a fourth transistor NM4 in the reference output adjusting unit 159, and a third transistor NM3 coupled between a drain of the first transistor NM 1 and a source of the second transistor NM2 in parallel with the first and second transistors NM1 and NM2. The first transistor has a gate coupled to the first output terminal Out1 on the second comparing and amplifying unit 153, and the second transistor NM2 has a gate coupled to the second output terminal Out2 on the second comparing and amplifying unit 153. The third transistor NM3 has a gate coupled to the power source terminal Vcc.

The reference output precharge adjusting unit 163 includes an invertor 163a for inverting the preset control signal, a first transistor NM1 having a drain coupled to the power source terminal and controlled by the precharge supply signal, a second transistor NM2 coupled in series to the first transistor and having a gate coupled to an output terminal on the first invertor 163a and a third transistor NM3 coupled in series to the second transistor NM2 and controlled by the CTD signal. A second invertor 163b inverts the CTD signal, and a fourth transistor NM4 is coupled between a ground terminal and the output terminal and has a gate coupled to an output terminal on the second invertor 163b. Preferably, all of the first, second, third, and fourth transistors are NMOS transistors.

Operations of the preferred embodiment of the reference level generating unit according to the present invention will now be described. The reference signal provided to the gate of the first transistor NM1 in the first comparing and amplifying unit 151 and the gate of the first transistor NM1 in the second comparing and amplifying unit 153 comes from the reference bitline. That is, the reference level generating unit receives a reference cell data signal. The reference level generating unit is controlled by control signals of the enable signal (e.g., preset control signal), the first precharge control signal and the CTD signal. A signal provided from the reference level generating unit is used as a reference signal for respective sense amplifiers. That is, the reference level generating unit is either enabled or disabled in response to the reference generating enable signal. When a high signal is provided to the NMOS transistors in the first enable adjusting unit 155 and the second enable adjusting unit 157, the NMOS transistors are enabled, to cause a current to flow from the power source terminal to the ground terminal. When the reference bitline signal is provided to the gates of the first transistor NM1 in the first comparing and amplifying unit 151 and the first transistor NM1 in the second comparing and amplifying unit 153, the reference bitline signal is amplified by the first, second, third and fourth transistors in the first and second comparing and amplifying units 151 and 153. A signal is fed from the reference output adjusting unit 159 back to the gates of the third transistor NM2 in the first comparing and amplifying unit 151 and the second transistor NM2 in the second comparing and amplifying unit 153. Then, the reference output adjusting unit 159 adjusts a reference output according to signals from the first comparing and amplifying unit 151 and the second comparing and amplifying unit 153. The reference output is adjusted by the first transistor NM1 having the gate for receiving a signal from the first comparing and amplifying unit 151 and the second and third transistors NM2 and PM1 each having the gate for receiving a signal from the second comparing and amplifying unit 153.

The reference signal adjusted by the reference output adjusting unit 159 is buffered at the reference output buffer unit 161. In this instance, the first and second transistors NM1 and NM2 in the reference output buffer unit 161 stabilize the adjusted reference level from the reference output adjusting unit 159 for preventing fluctuation of the level. That is, since signals provided to the gates of the first and second transistors NM1 and NM2 in the reference output buffer unit 161 have opposite phases during a transit period, a sharp output change can be prevented as an excessive response on the drain of the first transistor NM1 is offset when the same is reached to the source of the second transistor NM2. Further, since a voltage on the drain of the first transistor NM1 may not be provided adequately to the gate of the second transistor NM2 if a voltage to the gates of the first and second transistors NM1 and NM2 is low, the third transistor NM3 is held turned on for stable provision of the voltage on the drain of the first transistor to the source of the second transistor NM2. As described above, the first preferred embodiment is implemented using logic circuits and NMOS and PMOS transistors. However, the present invention is not intended to be so limited. For example, alternative logic circuits can be substituted or transistor conductivities can be implemented with related structural and signal modifications.

Figure 17:
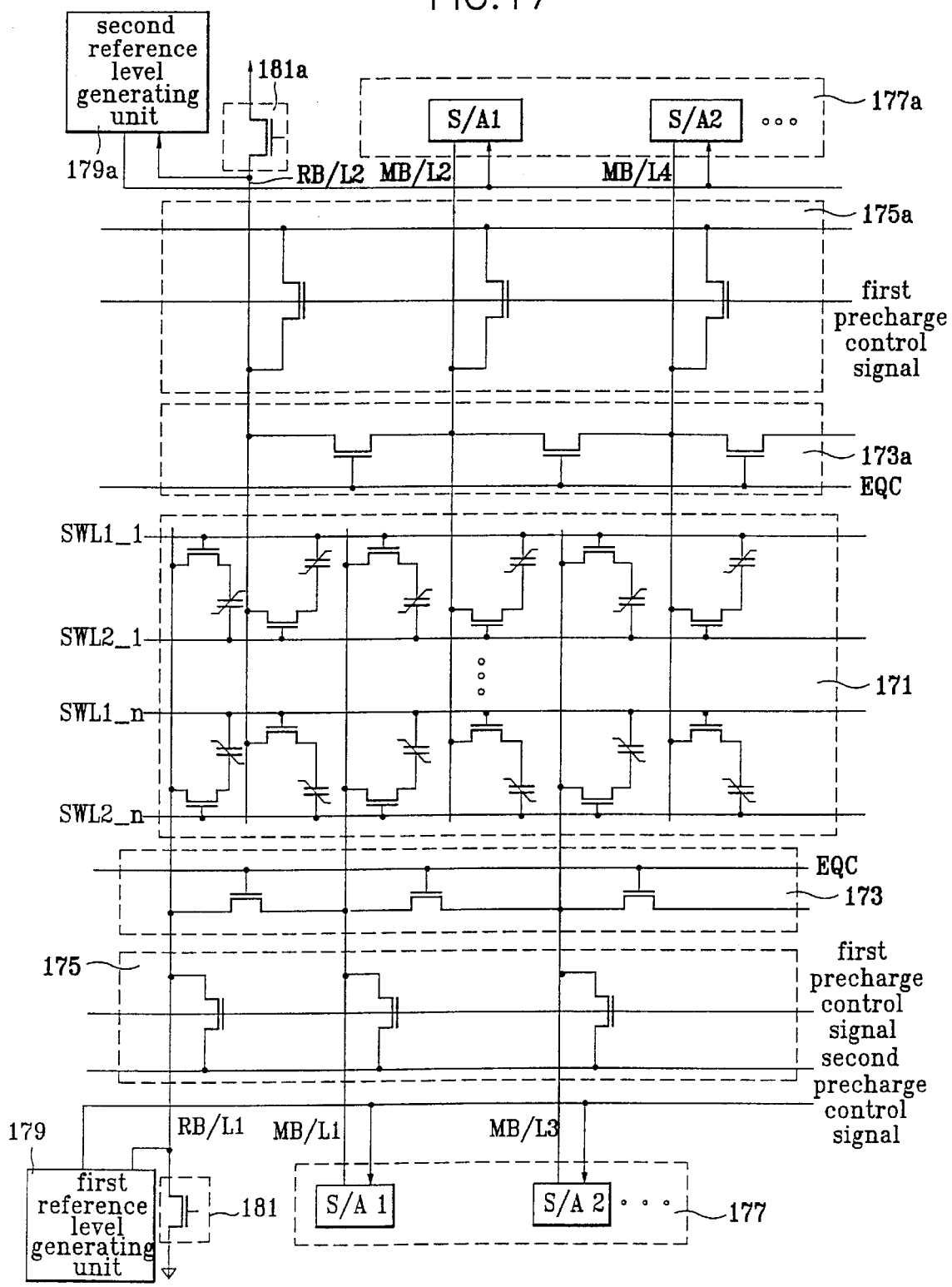

FIG. 17 is a diagram that illustrates a second preferred embodiment of a nonvolatile ferroelectric memory in accordance with the present invention. In the second preferred embodiment of the present invention sense amplifiers are above and below a cell array unit, with odd numbered bitlines coupled to the underlying sense amplifiers and even numbered bitlines coupled to the overlying sense amplifiers. However, the present invention is not intended to be so limited.

As shown in FIG. 17, the nonvolatile ferroelectric memory in accordance with the second preferred embodiment invention includes a cell array unit 171 having one pair of reference bitlines extending in a column direction, and a plurality of main bitlines on one side of the reference bitlines and a first equalizer unit 173 under the cell array unit 171 having equalizers each for equalizing adjacent bitlines among odd numbered main bitlines MB/L1, MB/L3, . . . and the first reference bitline RB/L1. A first precharge level adjusting unit 175 has NMOS transistors each coupled to the first reference bitline RB/L1 and odd numbered main bitlines MB/L1, MB/L3, . . . for adjusting a precharge level of a relevant bitline in response to a combination of the first precharge control signal and the second precharge control signal. A first sense amplifier unit 177 has sense amplifiers each coupled to an odd numbered main bitline for sensing a signal on the bitline, and a first reference level generating unit 179 is for amplifying a signal on the first reference bitline RB/LI and providing the same to the sense amplifiers as a reference voltage. A second equalizer unit 173a over the cell array unit 171 has equalizers each for equalizing adjacent bitlines among even numbered main bitlines MB/L2, MB/L4, . . . and the second reference bitline RB/L2. A second precharge level adjusting unit 175a is coupled to the second reference bitline and even numbered main bitlines for adjusting a precharge level of a relevant bitline in response to a combination of the first precharge control signal and the second precharge control signal, and a second sense amplifier unit 177a has sense amplifiers each coupled to an even numbered main bitline for sensing a signal on a relevant bitline. A second reference level generating unit 179a is amplifying a signal from the second reference bitline RB/L2 and providing the signal to the second sense amplifier unit 177a as a reference voltage. A first pull-down unit 181 and a second pull-down unit 181a are provided to the first reference bitline RB/L1 and the second reference bitline RB/L2 for pulling down a relevant reference bitline in response to a reference bitline control signal, respectively. The first and second precharge level adjusting units 175 and 175a are preferably NMOS transistors, each having a gate for receiving the first precharge control signal, a drain for receiving the second precharge control signal, and a source coupled to the corresponding bitline. Preferably, the first precharge control signal has a 3Vtn level, and the second precharge control signal has a Vtn level. Accordingly, the bitline connected to the source of the NMOS transistor is precharged to 2Vtn (i.e., =3Vtn−Vtn).

Different from the first preferred embodiment, the second preferred embodiment of the nonvolatile ferroelectric memory according to the present invention provides sense amplifier units over and under the cell array unit, so that signals on the odd numbered bitlines are sensed by the first sense amplifier unit 177 under the cell array unit and signals on the even numbered bitlines are sensed by the second sense amplifier unit 177a over the cell array unit. The reference voltage for the first sense amplifier unit 177 is supplied from the first reference level generating unit 179 and the reference voltage for the second sense amplifier unit 177a is supplied from the second reference level generating unit 179a. The first reference level generating unit 179 receives, amplifies, and forwards a signal on the first reference bitline RB/L1, and the second reference level generating unit 179a receives, amplifies, and forwards a signal on the second reference bitline RB/L2. Systems and operations of the first and second precharge level adjusting units 175 and 175b and the first and second equalizer units 173 and 173a are preferably similar to the precharge level adjusting unit and the equalizer unit according to the first preferred embodiment of the present invention. Systems and operations of the first and second reference level generating units 179 and 179a are preferably similar the first preferred embodiment of the reference level generating unit shown in FIG. 16. Accordingly, additional detailed descriptions are omitted.

As described above, preferred embodiments of a nonvolatile ferroelectric memory according to the present invention have various advantages. Generation of the precharge level in response to a combination of signals of the first precharge control signal provided to a gate and the second precharge control signal provided to the drain facilitates to increasingly stable precharge operation, which stabilizes the operation of the reference level generating unit. Elimination of level fluctuation of the reference voltage provided as a sense amplifier reference voltage permits a stable sensing operation and fast response. Further, if the reference bitline signal provided to the reference level generating unit is constant, the output is stable even if a noise occurred. Thus, a stable reference voltage can be obtained despite the noise.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A nonvolatile ferroelectric memory, comprising:
a cell array having at least one reference bitline and a plurality of main bitlines that extend along a first direction, and a plurality of pairs of first and second split wordlines that extend along a second direction to cross the bitlines;
an equalizing unit that equalizes the main and reference bitlines;
a precharge level adjustor that adjusts a precharge level of the bitlines in response to a combination of a first precharge control signal and a second precharge control signal;
a sense amplifier that senses signals on the main bitlines; and
a reference level generator that receives a reference bitline signal and forwards a reference voltage for the sense amplifier.

2. The nonvolatile ferroelectric memory of claim 1, wherein the precharge level adjustor adjusts a voltage difference of the second precharge control signal from the first precharge control signal using the precharge level on the bitlines.

3. The nonvolatile ferroelectric memory of claim 1, wherein the precharge level adjustor includes a transistor having a first electrode coupled to a corresponding bitline, a second electrode that receives the second precharge control signal, and a control electrode that receives the first precharge control signal.

4. The nonvolatile ferroelectric memory of claim 3, wherein the corresponding bitline has a prescribed voltage being the first precharge control signal provided to the control electrode minus the second control signal provided to the second electrode.

5. The nonvolatile ferroelectric memory of claim 4, wherein the first precharge control signal has a level of 3Vtn, and the second precharge control signal has a level of Vtn, wherein the Vtn is a threshold voltage of an NMOS transistor.

6. The nonvolatile ferroelectric memory of claim 1, further comprising:
a precharge supply signal generator; and
a precharge control signal selecting and forwarding unit, wherein the first precharge control signal is generated at the precharge supply signal generator at a prescribed level, and provided to the precharge level adjustor through the precharge control signal selecting and forwarding unit.

7. The nonvolatile ferroelectric memory of claim 6, wherein the precharge supply signal generator comprises:
a transition generator that detects a pad signal to generate a transition detection signal;
an enable adjustor that receives the transition detection signal and provides a first enable signal and a second enable signal;
a reference signal forwarding unit enabled in response to the first enable signal to provide a precharge reference signal;
a precharge level comparator enabled in response to the second enable signal to compare the precharge reference signal to a feedback control signal;
a precharge level generator controlled by a driving signal from the precharge level comparator that outputs the feedback control signal; and
a first precharge control signal forwarding unit that receives a supply signal from the precharge level generator to provide the first precharge control signal.

8. The nonvolatile ferroelectric memory of claim 7, wherein the precharge level comparator compares a level of the precharge reference signal to a level of the feedback control signal to enable the precharge level generator to provide a higher output if the level of the feedback control signal is lower than the level of the reference signal.

9. The nonvolatile ferroelectric memory of claim 7, wherein the precharge level comparator unit disables the precharge level generator if a level of the feedback control signal is not less than a level of the precharge reference signal.

10. The nonvolatile ferroelectric memory of claim 7, wherein the transition generator comprises:
a pulse width adjusting and delay unit comprising,
a delay unit with an even number of invertors coupled in series to delay the pad signal for a prescribed time period, and
a plurality of MOS capacitors each coupled to an output terminal on alternate ones of the invertors to stabilize a corresponding output signal;
a pulse width generating unit having a first logic gate that logically processes outputs from a first invertor and a last invertor among the even number of invertors to adjust a width of an output signal; and
a driving unit having a plurality of logic gates that each invert an output signal of the pulse width generating unit.

11. The nonvolatile ferroelectric memory of claim 7, wherein the enable adjustor comprises:
an inverter that inverts the transition detection signal;
a first buffer unit that buffers a signal from the invertor; and
a first transistor that switches a first reference voltage in response to a signal from the first buffer unit.

12. The nonvolatile ferroelectric memory of claim 7, wherein the reference signal forwarding unit comprises:
a first transistor having a control electrode that receives a first enable signal from the enable adjustor and a second electrode coupled to a second reference voltage;
a second transistor having a second electrode coupled to the first transistor, a first electrode coupled to an output terminal, and a control electrode that receives the second reference voltage;
a third transistor having a control electrode that receives the first enable signal from the enable adjustor and a second electrode coupled to a first reference voltage;
a fourth transistor having a second electrode coupled to a first electrode of the third transistor, a first electrode coupled to the output terminal, and a control electrode coupled to the second reference voltage;
a fifth transistor coupled between the second reference voltage and the output terminal and having a control electrode that receives the first reference voltage;
sixth to ninth transistors coupled in series between the output terminal and the first reference voltage and each having control and first electrodes coupled together; and
an output voltage stabilizer that stabilizes a signal on the output terminal.

13. The nonvolatile ferroelectric memory of claim 12, wherein the voltage on the output terminal of the reference signal forwarding unit is determined by a ratio of a threshold voltage of the fifth transistor and the threshold voltages of the sixth, seventh, eighth, and ninth transistors.

14. The nonvolatile ferroelectric memory of claim 13, wherein the output terminal voltage of the reference signal forwarding unit has a level of 3Vtn, and wherein the fifth transistor is a PMOS transistor, and the other transistors are n-channel enhancement transistors.

15. A nonvolatile ferroelectric memory of claim 7, wherein the precharge level comparator compares a 3Vtn level of the precharge reference signal from the reference signal forwarding unit and a level of the feedback control signal from the precharge level generator to enable the precharge level generator according to a result of the comparison.

16. The nonvolatile ferroelectric memory of claim 7, wherein the precharge level comparator comprises:
a first transistor having a control electrode that receives a signal from the reference signal forwarding unit, and a second electrode that receives the second enable signal from the enable adjustor;

a second transistor having a control electrode that receives the feedback control signal from the precharge level generator, and a second electrode that receives the second enable signal;

a third transistor having a second electrode that receives a second reference voltage, a first electrode coupled to an output terminal and a first electrode of the first transistor to switch the second reference voltage in response to a control electrode voltage; and a fourth transistor having a second electrode that receives the second reference voltage, a control and a first electrode coupled together, with the first electrode coupled to a first electrode of the second transistor.

17. The nonvolatile ferroelectric memory of claim 16, wherein the first and second transistors are n-channel enhancement transistors, and the third and fourth transistors are PMOS transistors.

18. The nonvolatile ferroelectric memory of claim 7, wherein the precharge level generator comprises:

a first inverter that inverts the driving signal from the precharge level comparator;

a second inverter that inverts an output signal from the first inverter;

a first transistor having a control electrode that receives the output signal from the first invertor, a second electrode coupled to a second reference voltage and a first electrode coupled to an input terminal on the first invertor; and a second transistor controlled by a signal from the second invertor having a second electrode coupled to the second reference voltage and a first electrode coupled to a control electrode to provide the feedback control signal to the precharge level comparator and to an output terminal.

19. The nonvolatile ferroelectric memory of claim 7, wherein the first precharge control signal forwarding unit comprises:

a first transistor having a second electrode coupled to a second reference voltage and a first electrode coupled to an output terminal; and four transistors coupled in series between the output terminal and a first reference voltage.

20. The nonvolatile ferroelectric memory of claim 19, wherein the first transistor is a PMOS transistor having a control electrode that receives the second reference voltage, and the four transistors coupled in series are n-channel enhancement transistors.

21. The nonvolatile ferroelectric memory of claim 6, wherein the precharge control signal selecting and forwarding unit comprises:

a first inverter that inverts the pad signal;

a first logic device that logically processes a signal from the first inverter and a cell block selection signal;

a second inverter that inverts a signal from the first logic device;

a first transistor having a second electrode that receives the first precharge control signal from the precharge supply signal generator and a first electrode coupled to an output terminal of the precharge control signal selecting and forwarding unit, and controlled by a signal from the first logic device;

a second transistor having a second electrode coupled to a first electrode of the first transistor, a first electrode coupled to a second reference voltage, and a control electrode that receives a signal from the second invertor;

a second logic device that logically processes a cell block selection signal and the transition detection signal; and a third inverter that inverts an output signal from the second logic device.

22. The nonvolatile ferroelectric memory of claim 21, wherein the first precharge control signal is provided to the precharge level adjustor in a relevant cell block through the output terminal of the precharge control signal selecting and forwarding unit.

23. The nonvolatile ferroelectric memory of claim 1, wherein the reference level generator comprises:

a first comparing and amplifying unit that compares the reference bitline signal to a signal fed back thereto, and amplifies an output signal;

a second comparing and amplifying unit that compares the reference bitline signal to a signal fed back thereto, and amplifies an signal;

a reference output adjusting unit that adjusts a level of the reference signal in response to the output signals from the first and second comparing and amplifying units;

a reference output buffer that buffers the adjusted reference signal in the reference output adjusting unit; and a reference output precharge adjusting unit that adjusts a precharge level of the reference bitline to a precharge level of a main bitline in response to the first precharge control signal and the transition detection signal.

24. The nonvolatile ferroelectric memory of claim 23, wherein the reference level generator comprises:

a first enable adjusting unit that enables the first comparing and amplifying unit; and a second enable adjusting unit that enables the second comparing and amplifying units.

25. The nonvolatile ferroelectric memory of claim 23, wherein the first comparing and amplifying unit comprises:

a first transistor having a control electrode that receives a signal from the reference bitline, a second electrode coupled to the first enable adjusting unit, and a first electrode coupled to a first output terminal;

a second transistor having a second electrode coupled to a second reference voltage and a first electrode and a control electrode coupled together, with the first electrode coupled to the first output terminal;

a third transistor having a control electrode that receives the fed back signal, a second electrode coupled to the first enable adjusting unit, and a first electrode coupled to a second output terminal; and a fourth transistor having a second electrode coupled to a second electrode of the second transistor, a first electrode coupled to the second output terminal, and a control electrode coupled to a control electrode of the second transistor.

26. The nonvolatile ferroelectric memory of claim 23, wherein reference output adjusting unit comprises:

a first transistor controlled by a signal from a second output terminal on the first comparing and amplifying unit and having a second electrode coupled to a fourth transistor in the first comparing and amplifying unit, and a first electrode coupled to a third transistor in the first comparing and amplifying unit;

a second transistor having a control electrode that receives a signal from a first output terminal on the second comparing and amplifying unit, a second electrode coupled to the second output terminal on the first comparing and amplifying unit, and a first electrode coupled to a first electrode of the first transistor;

a third transistor having a second electrode coupled to a second electrode of the first transistor, and a first electrode coupled to the third transistor in the first comparing and amplifying unit; and a fourth transistor having a second electrode coupled to a first electrode of the third transistor and operative in response to a preset control signal.

27. A nonvolatile ferroelectric memory of claim 23, wherein the reference output buffer comprises:

a first transistor having a control electrode coupled to a first output terminal on the second comparing and amplifying unit, and a second electrode coupled to an output terminal on the reference output adjusting unit; and a second transistor having a control electrode coupled to a second output terminal on the second comparing and amplifying unit and a second electrode coupled to a first electrode of the first transistor; and a third transistor having a control electrode that receives a second reference voltage, a second electrode coupled to a second electrode of the first transistor, and a first electrode coupled to a first electrode of the second transistor.

28. The nonvolatile ferroelectric memory of claim 23, wherein the reference output precharge adjusting unit comprises:

a first transistor having a second electrode coupled to a second reference voltage and a control electrode that receives the first precharge control signal;

a second transistor having a second electrode coupled to a first electrode of the first transistor and a control electrode that receives an inverted preset control signal;

a third transistor having a second electrode coupled to a first electrode of the second transistor, and a control electrode that receives a transition detection signal, and a first electrode coupled to an output terminal; and a fourth transistor having a second electrode coupled to a first reference voltage, a first electrode coupled to the output terminal, and a control electrode that receives an inverted transition detection signal.

29. A nonvolatile ferroelectric memory comprising:

a cell array unit having a first and second reference bitlines, and a plurality of main bitlines on one side of the reference bitlines that extend along a first direction, and a plurality of pairs of first and second split wordlines that extend in a second direction crossing the bitlines;

a first equalizer under the cell array unit that equalizes adjacent bitlines among odd numbered main bitlines and the first reference bitline;

a first precharge level adjustor that adjusts levels of the odd numbered bitlines and the first reference bitline in response to a first precharge control signal and a second precharge control signal;

a first sense amplifier that senses and amplifies signals on the odd numbered bitlines;

a first reference level generator that receives amplifies a signal on the first reference bitline and provides a result as a reference signal for the first sense amplifier;

a second equalizer over the cell array unit that equalizes adjacent bitlines among even numbered main bitlines and the second reference bitline;

a second precharge level adjustor that adjusts levels of the even numbered bitlines and the second reference bitline in response to the first precharge control signal and the second precharge control signal;

a second sense amplifier that senses and amplifies signals on the even numbered bitlines; and a second reference level generator that amplifies a signal on the second reference bitline and provides a result as a reference signal to the second sense amplifier.

30. The nonvolatile ferroelectric memory of claim 29, wherein the first and second precharge level adjustors adjust a voltage difference of the second precharge control signal from the first precharge control signal to a precharge level on the bitlines.

31. The nonvolatile ferroelectric memory of claim 29, wherein each of the first and second precharge level adjustors includes transistors each having a first electrode coupled to a main bitline, a second electrode that receives the second precharge control signal, and a control electrode that receives the first precharge control signal.

32. The nonvolatile ferroelectric memory of claim 29, wherein the main bitline has a voltage provided thereto being the second precharge control signal provided to the second electrode subtracted from the first precharge control signal provided to the control electrode.

33. A memory device having a cell array with at least one reference bitline and a plurality of main bitlines that extend along a first direction, and a plurality of wordlines that extend along a second direction to cross the bitlines, a decoder coupled to the bitlines, a driving circuit coupled to the wordlines, and a sense amplifier that senses signals on the main bitlines, the improvement comprising:

a precharge level adjustor that adjusts a precharge level of the bitlines in response to a combination of the first precharge control signal and a second precharge control signal, wherein the precharge supply signal generator comprises, a transition generator that detects a pad signal to generate a transition detection signal, an enable adjustor that receives the transition detection signal and provides a first enable signal and a second enable signal, a reference signal forwarding unit enabled in response to the first enable signal to provide a precharge reference signal, a precharge level comparator enabled in response to the second enable signal to compare the precharge reference signal to a feedback control signal, a precharge level generator controlled by a driving signal from the precharge level comparator that outputs the feedback control signal, and a first precharge control signal forwarding unit that receives a supply signal from the precharge level generator to provide the first precharge control signal.

34. A memory device having a cell array with at least one reference bitline and a plurality of main bitlines that extend along a first direction, and a plurality of wordlines that extend along a second direction to cross the bitlines, a decoder coupled to the bitlines, a driving circuit coupled to the wordlines, and a sense amplifier that senses signals on the main bitlines, the improvement comprising:

a reference level generator that receives a reference bitline signal and forwards a reference voltage for the sense amplifiers, wherein the reference level generator comprises, a first comparing and amplifying unit that compares the reference bitline signal to a signal fed back thereto, and amplifies an output signal, a second comparing and amplifying unit that compares the reference bitline signal to a signal fed back thereto, and amplifies an signal, a reference output adjusting unit that adjusts a level of the reference signal in response to the output signals from the first and second comparing and amplifying units, a reference output buffer that buffers the adjusted reference signal in the reference output adjusting unit, a reference output precharge adjusting unit that adjusts a precharge level of the reference bitline to a precharge level of a main bitline in response to a first precharge control signal and the transition detection signal, a first enable adjusting unit that enables the first comparing and amplifying unit, and a second enable adjusting unit that enables the second comparing and amplifying unit.

* * * * *